US008078996B2

(12) United States Patent
Izuha et al.

(10) Patent No.: US 8,078,996 B2
(45) Date of Patent: Dec. 13, 2011

(54) METHOD AND SYSTEM FOR CORRECTING A MASK PATTERN DESIGN

(75) Inventors: Kyoko Izuha, Yokohama (JP); Shigeki Nojima, Yokohama (JP); Toshiya Kotani, Machida (JP); Satoshi Tanaka, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 188 days.

(21) Appl. No.: 12/457,751

(22) Filed: Jun. 19, 2009

(65) Prior Publication Data

US 2009/0265680 A1  Oct. 22, 2009

Related U.S. Application Data

(63) Continuation of application No. 11/012,494, filed on Dec. 16, 2004, now Pat. No. 7,571,417.

(30) Foreign Application Priority Data

Dec. 18, 2003  (JP) .................................. 2003-421349

(51) Int. Cl.
G06F 17/50 (2006.01)

(52) U.S. Cl. ................ 716/53; 716/50; 716/51; 716/54; 716/55; 430/5; 430/30; 355/402; 355/403

(58) Field of Classification Search .............. 716/50–55; 430/5, 30; 355/402–403
See application file for complete search history.

(56) References Cited

U.S. PATENT DOCUMENTS

| 5,879,844 | A | | 3/1999 | Yamamoto et al. |
| 5,969,801 | A | * | 10/1999 | Tsudaka ........................ 355/55 |
| 6,077,310 | A | | 6/2000 | Yamamoto et al. |
| 6,221,539 | B1 | | 4/2001 | Kotani et al. |
| 6,470,489 | B1 | | 10/2002 | Chang et al. |
| 6,665,856 | B1 | * | 12/2003 | Pierrat et al. .................... 716/53 |

(Continued)

FOREIGN PATENT DOCUMENTS

JP  09-319067  12/1997

(Continued)

OTHER PUBLICATIONS

Notification of Reasons for Rejection issued by the Japanese Patent Office on Apr. 1, 2008, for Japanese Patent Application No. 2003-421349, and English-language translation thereof, (see U.S. Appl. No. 11/012,494).

(Continued)

*Primary Examiner* — Nghia Doan
(74) *Attorney, Agent, or Firm* — Finnegan, Henderson, Farabow, Garrett & Dunner, L.L.P.

(57) ABSTRACT

A pattern verification method includes preparing a desired pattern and a mask pattern forming the desired pattern on a substrate, defining at least one evaluation point on an edge of the desired pattern, defining at least one process parameter to compute the transferred/formed pattern, defining a reference value and a variable range for each of the process parameters, and computing a positional displacement for each first points corresponding to the evaluation point, first points computed using correction mask pattern and a plurality of combinations of parameter values obtained by varying the process parameters within the variable range or within the respective variable ranges. The positional displacement is a displacement between first point and the evaluation point. The method further includes computing a statistics of the positional displacements for each of the evaluation points, and outputting information modifying the mask pattern according to the statistics.

7 Claims, 16 Drawing Sheets

U.S. PATENT DOCUMENTS 7,384,710 B2 * 6/2008 Ogawa et al. .................. 430/5
7,571,417 B2 * 8/2009 Izuha et al. .................. 716/53

FOREIGN PATENT DOCUMENTS

| | | |
|---|---|---|
| JP | 2003-167323 | 6/2003 |
| JP | 2003-303742 | 10/2003 |

OTHER PUBLICATIONS

Newmark, D. M. et al., "Large Area Optical Proximity Correction Using Pattern Based Corrections", SPIE, vol. 2322, Photomask Technology and Management, pp. 374-386, (1994), (see U.S. Appl. No. 11/012, 494).

* cited by examiner

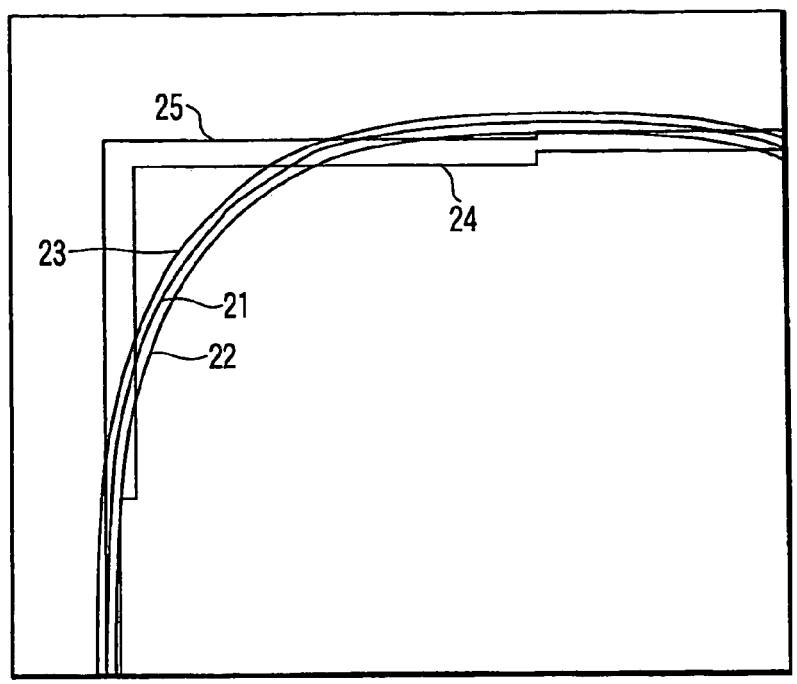
F I G. 10
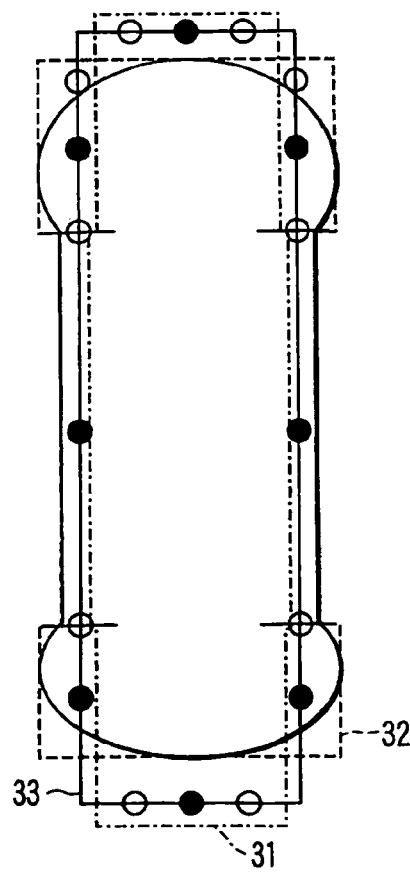
F I G. 11

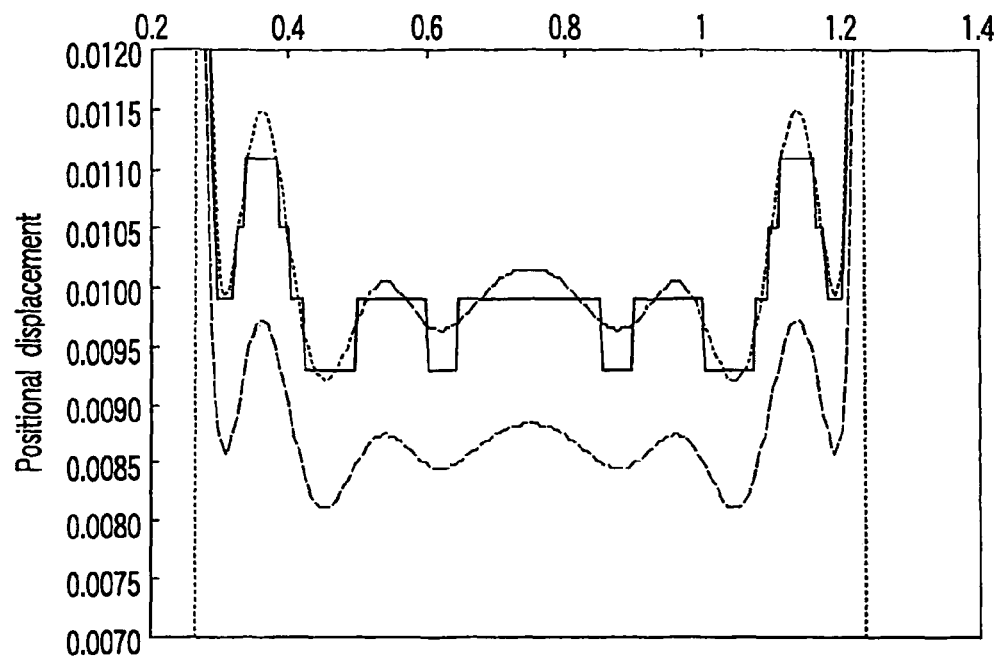
F I G. 19
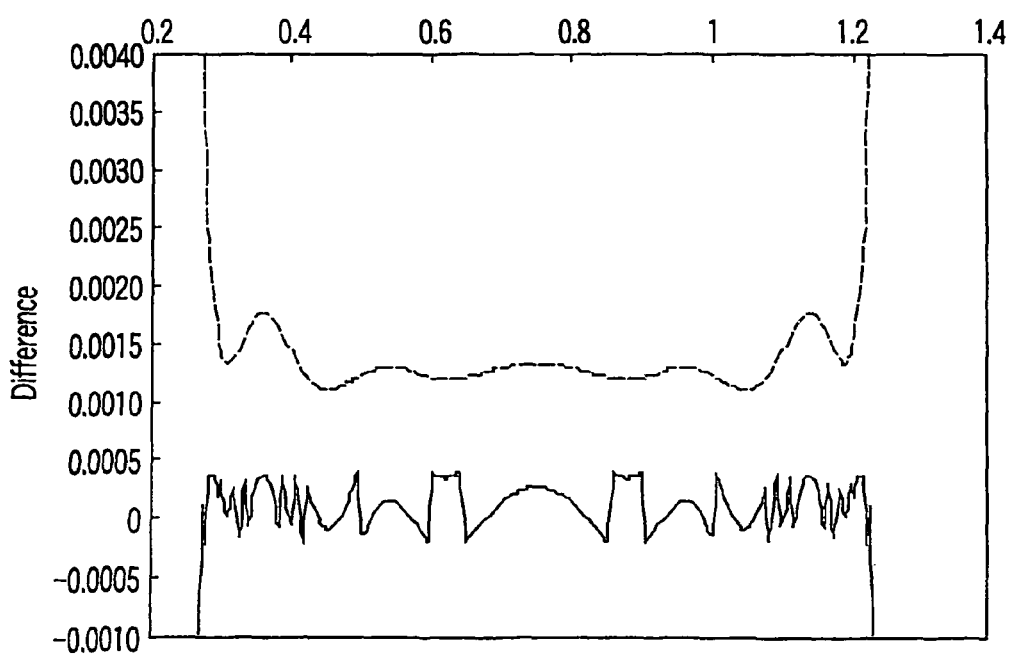
F I G. 20

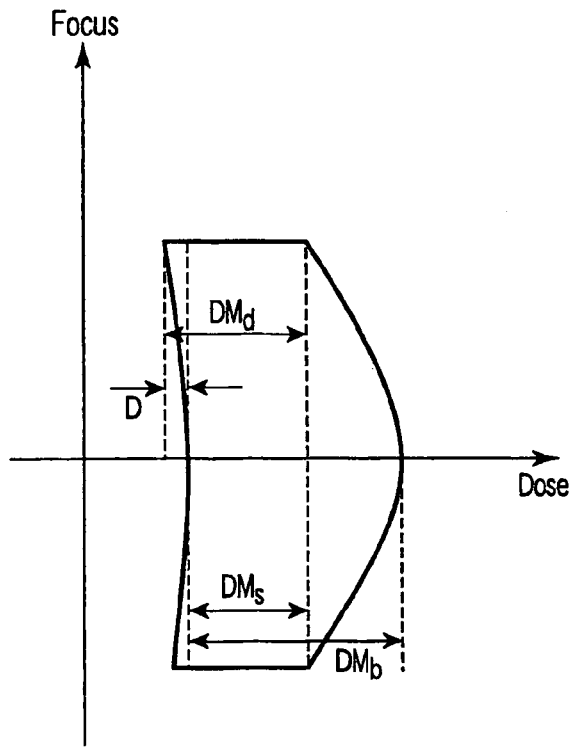
F I G. 26
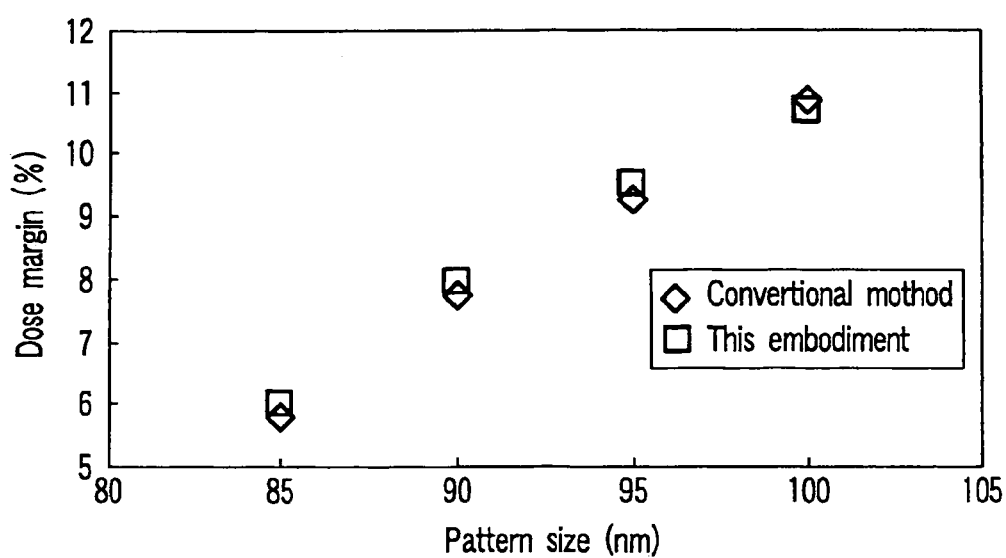
F I G. 27

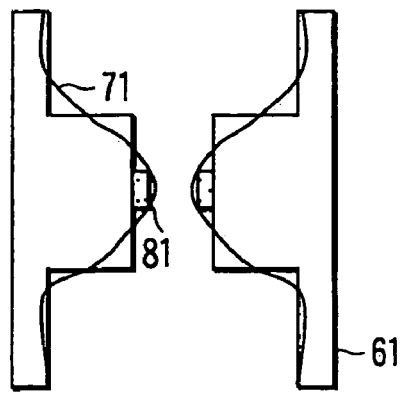
F I G. 30A
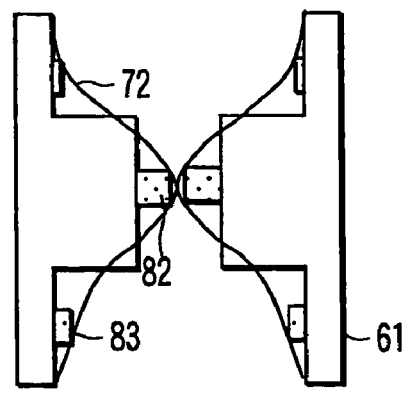
F I G. 30B
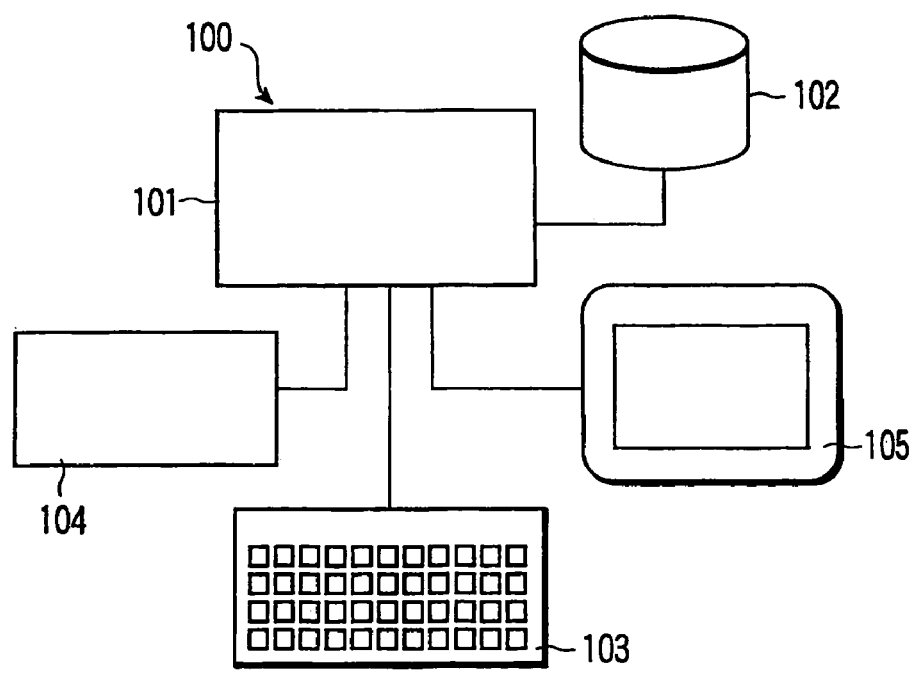
F I G. 31

METHOD AND SYSTEM FOR CORRECTING A MASK PATTERN DESIGN

This application is a continuation of application Ser. No. 11/012,494, filed on Dec. 16, 2004 now U.S. Pat. No. 7,571,417, which is based upon and claims the benefit of priority from prior Japanese Patent Application No. 2003-421349, filed Dec. 18, 2003, the entire contents of which are incorporated herein by reference.

BACKGROUND OF THE INVENTION

1. Field of the Invention

This invention relates to a pattern verification method, a pattern verification system, a mask manufacturing method and a semiconductor device manufacturing method to be used for manufacturing a semiconductor device, a liquid crystal display element or the like.

2. Description of the Related Art

The progress of semiconductor manufacturing technologies in recent years is very remarkable. Semiconductor devices with a minimal processing size of 0.18 μm are currently being manufactured. Such micronization has been made feasible by the advancement of micro pattern forming technologies including mask process technologies, photolithography technologies and etching technologies. In the era when large pattern sizes are common, the surface profile of the LSI pattern to be formed is drawn on a wafer as mask pattern and a mask pattern exactly the same as the first mask pattern is formed and transferred onto the wafer by means of a projection optical system so that a pattern substantially identical with the first mask pattern is formed on the wafer by etching the underlying layer. However, in the course of micronization of mask patterns, it has been increasingly difficult to form a pattern exactly the same as the first pattern in the pattern forming process to give rise to a problem that the final dimensions of the finished product to not exactly agree with those of the mask pattern.

Particularly, in the case of lithography and etching process that is essential to micro-processing, the dimensional precision of a pattern to be formed is significantly influenced by the layout environment of the patterns other than the pattern to be formed that are arranged around the pattern. Thus, the optical proximity correction (OPC) technique and the process proximity correction (PPC) technique (to be referred to as PPC technique hereinafter) of adding an auxiliary pattern to a mask pattern in advance have been reported with the aim of reducing the influence and forming a desired pattern with the intended dimensions after the micro-processing operation.

As the optical proximity correction (OPC) technique and the process proximity correction (PPC) technique have become more sophisticated than ever, it is currently not easy to predict the profile of the pattern to be finished on a wafer because of the large difference between the pattern designed by a designer and the mask pattern that is actually used at the time of exposure to light and hence it is necessary to verify the finished product by means of a lithography simulator. D. M. Newmark et al., "Large Area Optical Proximity Correction Using Pattern Based Correction", SPIE Vol. 2322 (1994) 374, proposes a verification tool for comparing the edges of a desired pattern to be formed on a wafer and those of the pattern transferred by using the layout after OPC and checking if the difference is found within a predetermined allowable range or not.

Japanese Patent Application Laid-Open No. 9-319067 proposes a technique for highly precisely predicting the positional displacement between the edges of a desired pattern and those of the corresponding transferred pattern by preparing physical models for proximity correction and verification. According to this proposal, a means for dissolving the problem of consuming a vast amount of time for verification at the full chip level of the device is also provided. More specifically, the above cited patent document proposes a verification technique realized by combining a rule-based correction technique of conducting corrections according to predetermined correction rules and a simulation-based correction technique of using a simulator for preparing models of phenomena that appear as a result of the exposure/development process.

To date, it has been possible to output the results of a transfer simulation realized by repeating the operation of optical proximity correction (OPC) and using the layout of the finished mask and that of the mask obtained as a result of the repeated OPC operation. However, the obtained information does not contain information that tells the designer about how to draw the layout.

Additionally, with the known verification processes using a lithography simulator, it is necessary to compute the light intensity at many evaluation points to make them very time-consuming ones. Therefore, there is a strong demand for a verification process that can improve the turnaround time (TAT) of the flow of the verification process.

Meanwhile, patterns on wafers are accompanied by problems that can roughly be classified into two types. One is that the obtained pattern shows discrepancies from the desired pattern regardless of the conditions under which the transfer operation is conducted and the other is that the obtained pattern does not give rise to any problem under "ideal" conditions but shows discrepancies once the process conditions change.

However, it is not possible to discriminate the above two types of problems for the produced pattern because what is output by any of the known techniques is the data obtained by comparing the produced pattern with the desired pattern, or the "ideal" pattern.

As discussed above, to date, while it has been possible to output the results of verification of the desired pattern and the mask pattern, it has not been possible to provide the designer with a guideline when the mask pattern requires to be modified. Additionally, it is desired to improve the TAT of the flow or the verification process. Still additionally, while it has been possible to compare the desired pattern and the mask pattern, it has not been possible to tell if the problem, if any, of a pattern is attributable to the desired pattern or to the process conditions.

BRIEF SUMMARY OF THE INVENTION

In an aspect of the present invention, there is provided a pattern verification method comprising: preparing a desired pattern and a mask pattern for forming the desired pattern on a substrate; defining at least one evaluation point on an edge of the desired pattern; defining at least one process parameter for computing the transferred/formed pattern; defining a reference value and a variable range for each of the process parameters; computing a positional displacement for each first points corresponding to the evaluation point, first points computed using correction mask pattern and a plurality of combinations of parameter values obtained by varying the process parameters within the variable range or within the respective variable ranges, the positional displacement being displacement between first point and the evaluation point; computing a statistics of the positional displacements for each of the evaluation points; and outputting information for modifying the mask pattern according to the statistics.

In another aspect of the present invention, there is provided a pattern verification method comprising: preparing a desired pattern and a mask pattern for forming a first formed pattern corresponding to the desired pattern on a substrate; generating edges by dividing the edge of the mask pattern by a predetermined length; defining a correction point on each of the edges generated by dividing the edge of the desired pattern; computing a correction quantity in consideration of the proximity effect for each of the correction points; forming a correction mask pattern by moving the generated edges according to the computed correction quantities; defining at least one evaluation point on the edge of the correction mask pattern; defining at least one process parameter for forming a pattern which being resist pattern formed on the substrate by using the correction mask pattern or being pattern formed in the substrate by using the resist patterns as a mask; defining a reference value and a variable range for each of the process parameters for forming the second transferred/formed pattern; computing first transferred/formed patterns which being resist patterns formed on the substrate or being patterns formed in the substrate by using the resist patterns as a mask, the first transferred/formed patterns being computed using correction mask pattern and a plurality of combinations of parameter values obtained by varying the process parameters within the variable range or within the respective variable ranges; computing a positional displacement of the corresponding edge from the evaluation point of the edge of the pattern transferred/formed on the substrate from the correction mask pattern; computing a statistic of the positional displacements for the evaluation points; and outputting information for modifying the mask pattern according to the statistic.

BRIEF DESCRIPTION OF THE SEVERAL VIEWS OF THE DRAWING

FIG. 10 is a schematic illustration of the results of an operation of generating patterns near an edge of a desired pattern by varying the process parameter within a predetermined range;

FIG. 11 is a schematic illustration of a recommended pattern to be used for forming a desired pattern;

FIG. 19 is a graph illustrating the positional displacements under the defocus/best dose conditions;

FIG. 20 is a graph illustrating the differences between the conventional method and the slope method and the differences between the spline method and the conventional method under the best focus/best dose conditions;

FIG. 26 is a graph illustrating the ED-tree to be referred to when describing the fourth embodiment of pattern verification method;

FIG. 27 is a graph illustrating the results of an operation of determining the margin of the same layout by means of the conventional method and also by means of this embodiment of method;

FIGS. 30A and 30B are schematic illustrations of a pattern and a desired pattern and error mark obtained by simulation; and FIG. 31 is a schematic illustration of an eighth embodiment of the present invention, which is a pattern verification system.

DETAILED DESCRIPTION OF THE INVENTION

Now, embodiments of the present invention will be described in greater detail with reference to the accompanying drawings.

1st Embodiment

Figure 1:
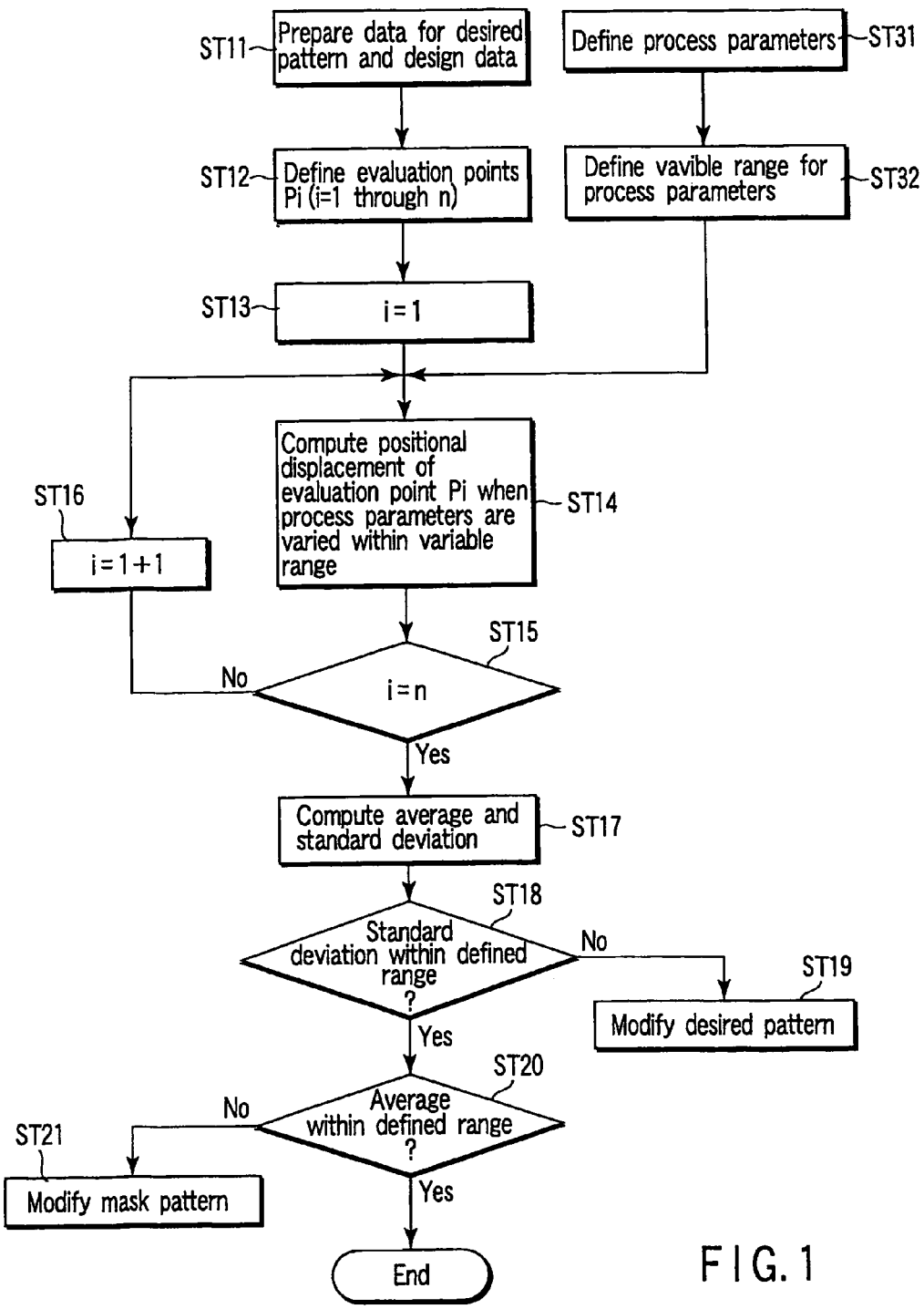
FIG. 1 is a flow chart summarily illustrating the sequence of a first embodiment of pattern verification method according to the invention.

FIG. 1 is a flow chart summarily illustrating the sequence of the first embodiment of pattern verification method according to the invention. FIGS. 2A through 2D are illustrations of the first embodiment of pattern verification method according to the invention.

Figure 2A:
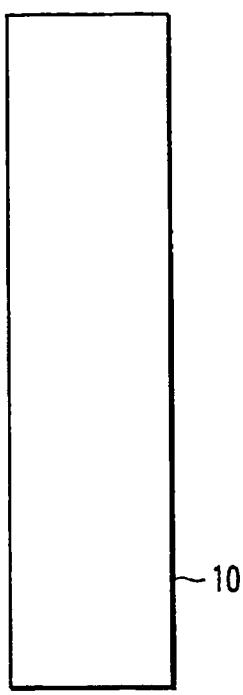
FIGS. 2A through 2D are illustrations of the first embodiment of pattern verification method according to the invention.
Figure 2B:
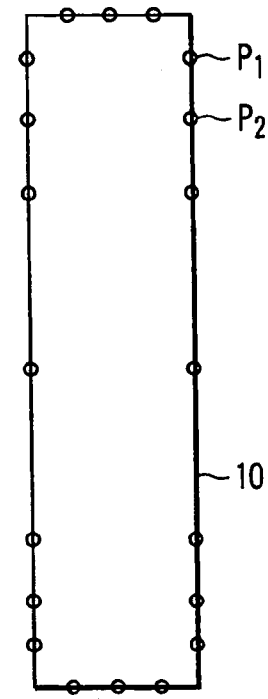

Firstly, draft circuit pattern data that are necessary for securing the device characteristics when designing an LSI or the like are prepared. Data for a mask pattern that is an enlarged draft circuit pattern are also prepared by taking the scale reduction ratio of the projection optical system of an aligner (Step ST11). FIG. 2A illustrates a desired pattern 10 that is contained in a draft circuit layout. A total of n evaluation points Pi (i=1 through n) are defined along the edges of the desired pattern 10 that is contained in the design data (Step ST12). The evaluation points are generated at respective positions whose coordinates are specified in advance and an evaluation point is arranged without fail at a point separated from each corner by 100 µm.

Reference values (design values) are defined for the process parameters that can give rise to positional displacements of pattern edges (Step ST31). The process parameters may include the film thickness of the resist film, the numerical aperture NA, the dose and the parameters for exposure including the defocusing value as well as post-exposure parameters such as the PEB temperature and the development time.

Then, a variable range relative to the reference value is defined for each process parameter (Step ST32). In this embodiment, the variable range of the dose is defined in terms of under dose~the best dose ~over dose. The variable range of the focus position is defined in terms of the best focus~defocus. The process parameters other than the dose and the focus position are made invariable from the defined values.

The following processing operation is conducted for all the defined evaluation points (Step ST13 through ST16). The value of each process parameter is modified within the defined variable range thereof in Step ST12 and the positional displacement of the evaluation point Pi (i=1) is determined for a plurality of combinations of parameter values (Step ST14). In this embodiment, three combinations including (the best dose/the best focus), (over dose/defocus) and (under dose/defocus) are used to compute the positional displacement of the edges. However, it is possible to compute for all possible combinations of doses and focuses simultaneously without any additional load. At the same time, it is also possible to compute the positional displacements that can be produced just like the defined dose, the defined focus, the process parameters, the numerical aperture of the aligner, the coherence factor, the center shielding ratio and/or the aberration change. It is also possible to use all or part of the parameters of the items that can participate in positional displacement and hence the parameters that are used in this embodiment are not limited to those listed above.

Figure 3:
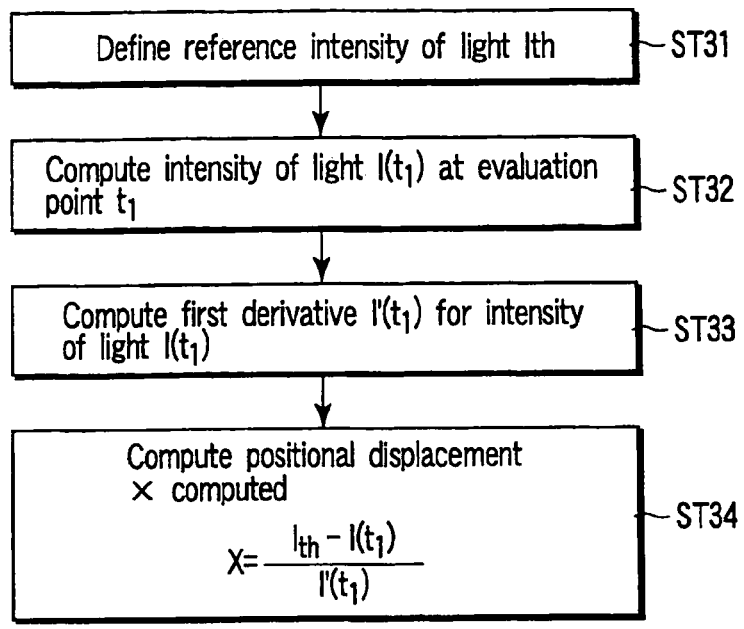
FIG. 3 is a flow chart of the sequence of the operation of determining the positional displacement of the edges.

Now, the method of determining the positional displacement will be described by referring to FIG. 3. FIG. 3 is a flow chart of the sequence of the operation of determining the positional displacement of the edges.

Firstly, the reference light intensity ($I_{th}$) is defined to form the desired pattern 10 on a wafer in order to meet the requirements imposed by the subsequent photo-etching process and other processes (Step ST31).

Subsequently, the light intensity $I(t_1)$ at the evaluation point $P_i$ with the positional coordinate $t_1$ on the desired pattern 1 is computed by using the Hopkins formula (formula (1)) (Step ST32);

$$I(t) = \int\int_{-\infty}^{\infty} TCC(\omega, \omega') \times M(\omega) \times M(\omega')^* \times \exp\{i(\omega - \omega')t\}d\omega d\omega' \quad (1)$$

where TCC (ω, ω'):transmission cross coefficient, ω, ω':spatial frequency.
I(t):function for expressing the light intensity at positional coordinate t;
M(ω):Fourier transform of mask complex transmission distribution on the frequency plane,
M(ω'):complex conjugate of Fourier transform of mask complex transmission distribution on the frequency plane and
i:imaginary unit.

To compute the light intensity $I(t_1)$ by using the Hopkins formula, it is necessary to carry out the following computations in advance.
(1) preparation of mask pattern data defining the complex amplitude transmission distribution from the mask pattern and computation of the mutual transmission coefficient TCC(ω, ω')
(2) Fourier transformation of the complex amplitude transmission distribution of the mask pattern to obtain M(ω) and M*(ω')
(3) computation of the product of multiplication of the mutual transmission coefficient TCC(ω, ω'), the Fourier transform M(ω) and M*(ω') (TCC(ω, ω')×M(ω)×M*(ω')).
(4) Inverse Fourier transformation of the mutual transmission coefficient TCC(ω, ω')×M(ω)×M*(ω').
(5) Integration of the product of multiplication of {TCC(ω, ω')×M(ω)×M*(ω')} and exp {i(ω−ω')t} for ω, ω'.

Then, the first derivative $I'(t_1)$ of the light intensity $I(t_1)$ at the evaluation point $P_i$ with the coordinate $t_1$ is computed by using formula (2) below (Step ST33).

$$I'(t) = \int\int_{-\infty}^{\infty} TCC(\omega, \omega') \times M(\omega) \times \\ M(\omega')^* \times i(\omega - \omega') \times \exp\{i(\omega - \omega')t\}d\omega d\omega' \quad (2)$$

In the computation using the above formula (2), the part of exp(i(ω−ω')t) that requires a large computational load is determined by referring to the result of computation obtained when determining the light intensity $I(t_1)$ in Step ST32.

Then, the CD displacement X is determined by using formula (3) below, the light intensity $I(t_1)$, the first derivative $I'(t_1)$ of the light intensity and the reference light intensity Ith (Step ST34).

$$X = \frac{I_{th} - I(t_1)}{I'(t_1)} \quad (3)$$

Figure 4:
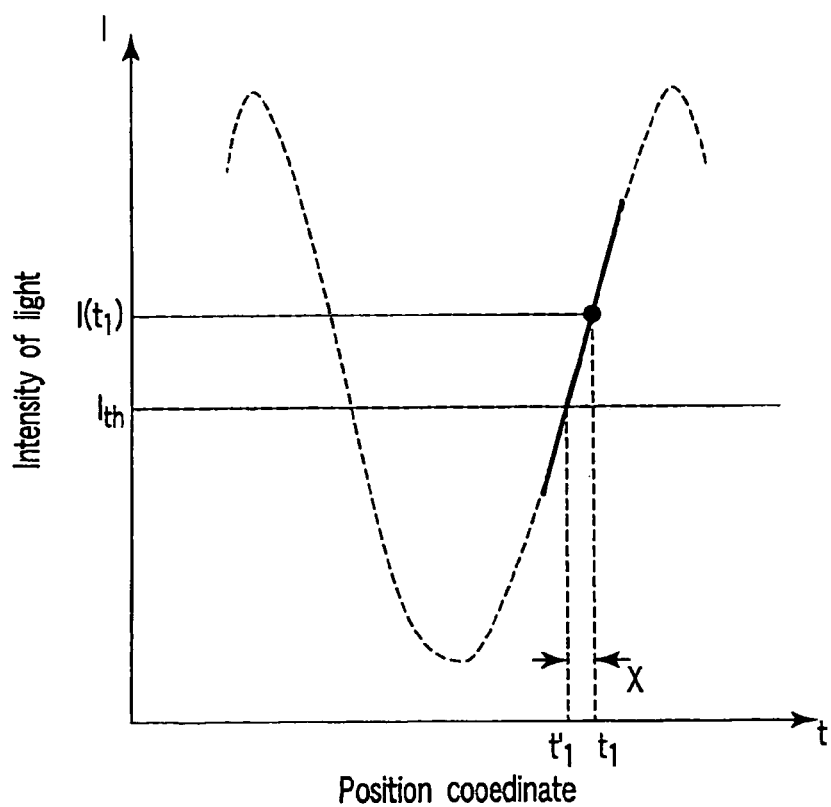
FIG. 4 is a graph schematically illustrating the light intensity on the substrate as obtained from a mask pattern.

Now, the reason why the positional displacement X can be determined from the formula (3) above will be described with reference to FIG. 4. FIG. 4 is a graph schematically illustrating the light intensity on the substrate as obtained from a mask pattern.

The first derivative $I'(t_1)$ indicates the slope at position $t_1$ of the function I(t) expressing the light intensity. Assume that the linear function that passes through position $(t_1, I(t_1))$ and shows an slope $t_2$ is expressed by $I'(t_1) \times t + c$ (where c is a constant). The positional coordinate $t'_1$ of the slope of the linear function f(t) and $I_{th}$ is $(I_{th}−c)/I'(t_1)$ from the linear function. $t_1=(I(t_1)-c)/I'(t_1)$. Since the positional displacement X is $t_2-t_1$, it can be determined from the formula (3) above.

Similarly, when the light intensity distribution at and near an arbitrarily selected coordinate t on the desired pattern is approximated by the second derivative I" (t) of the light intensity distribution, the relationship between the reference light intensity $I_{th}$ and the CD displacement X is expressed by formula (4) below.

$$I_{th} = \frac{1}{2} I''(t) X^2 + I'(t) X + I(t) \quad (4)$$

Thus, the CD displacement X is given by solving quadratic equation (5) below.

$$X = \frac{-I'(t) \pm \sqrt{I'(t) \times I'(t) - 2 \times I''(t) \times (I_{th} - I)}}{I''(t)} \quad (5)$$

At and near each corner, the positional displacement in each of the two rectangularly intersecting directions is determined.

Then, the average value and the standard deviation of the positional displacements of all the evaluation points $P_i$ (i=1 through n) are determined (Step ST17). Then, it is determined if the standard deviation is found within the predefined variable range for positional displacement or not (Step ST18).

Figure 2C:
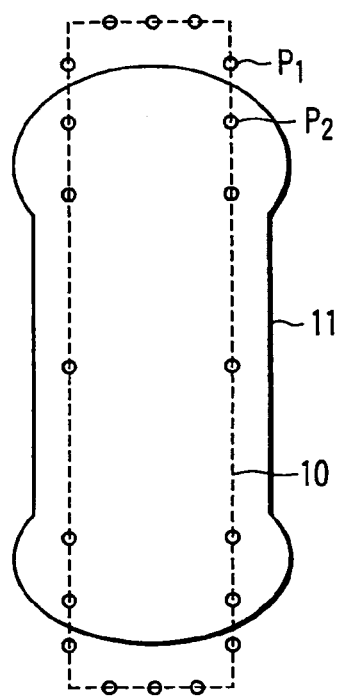
Figure 2D:
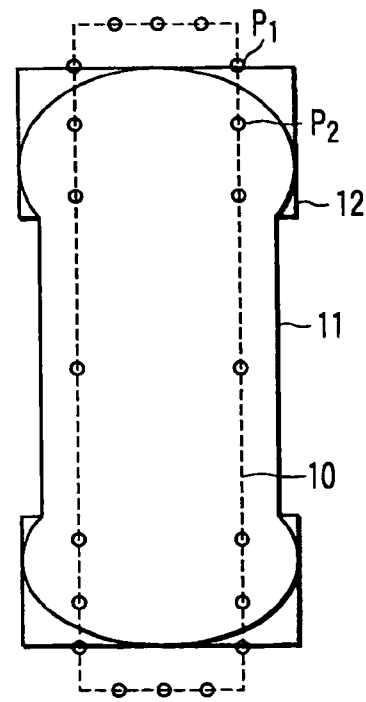

If the standard deviation is found to be out of the predefined variable range for positional displacement, the desired pattern has to be modified (Step ST19). The largest positional displacement of the edge is extracted for each evaluation point and a pattern 11 is prepared by connecting the extracted positional displacements (FIG. 2C). In the instance of FIG. 2C, the desired pattern 10 is dimensionally reduced according to the scale reduction ratio of the aligner so that the desired pattern 10 and the pattern 11 are drawn on the same scale. Then, another pattern 12 is generated with edges shifted from those of the desired pattern by the largest positional displacements (FIG. 2D) and a pattern is generated with edges shifted in opposite directions by the amounts obtained by dividing the extracted largest positional displacements by the MEF (mask error factor, or the ratio of the dimensional change relative to the variance of the mask) so as to be used as recommended draft layout.

When the standard deviations is found to be within the predefined variable range for positional displacement, it is determined if the average of the positional displacements is found within a predefined range for average or not (Step ST20). If the average of the positional displacements is found to be out of the predefined variable range for average, the mask pattern has to be modified (Step ST21).

Figure 5:
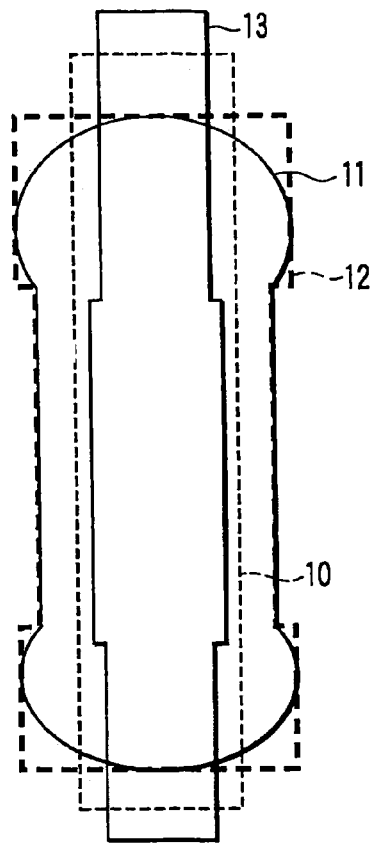
FIG. 5 is a schematic illustration of a recommended pattern to be used for forming a desired pattern.

FIG. 5 shows a result of a recommended pattern obtained by using the technique of this embodiment. In FIG. 5, reference symbol 13 denotes a recommended pattern (mask pattern) to be used for forming a desired pattern on a wafer. It is possible to form a desired pattern on a wafer by drawing a layout, shifting the edges according to the obtained results.

In other words, it is possible to form a desired pattern on a wafer by modifying the draft layout according to the output layout or provide a design guideline.

If a plurality of evaluation points are used on the desired pattern in Step ST33, the same X coordinate and the same Y coordinate can be shared by more than one evaluation points because evaluation points are arranged linearly. Thus, it is only necessary to carry out the computation of inverse Fourier transformation that involves a heavy computational load for acquiring an optical image only once for an evaluation point because the result of the computation can be referred to for all the remaining evaluation points. In other words, the computational load of this embodiment does not rise significantly if the number of evaluation points is increased to raise the level of accuracy of evaluation.

As a result of an experiment using a conventional technique and the technique of this embodiment and common data for the same process, it was found that the conventional technique consumed 420 hours, whereas the technique of this embodiment consumed only 36 hours.

Figure 6:
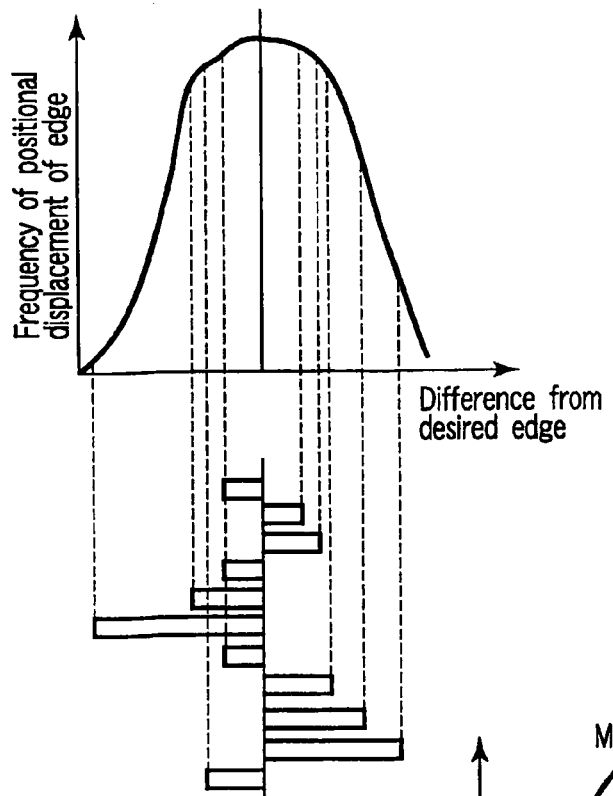
FIG. 6 is a graph illustrating the frequency distribution of positional displacements.
Figure 7:
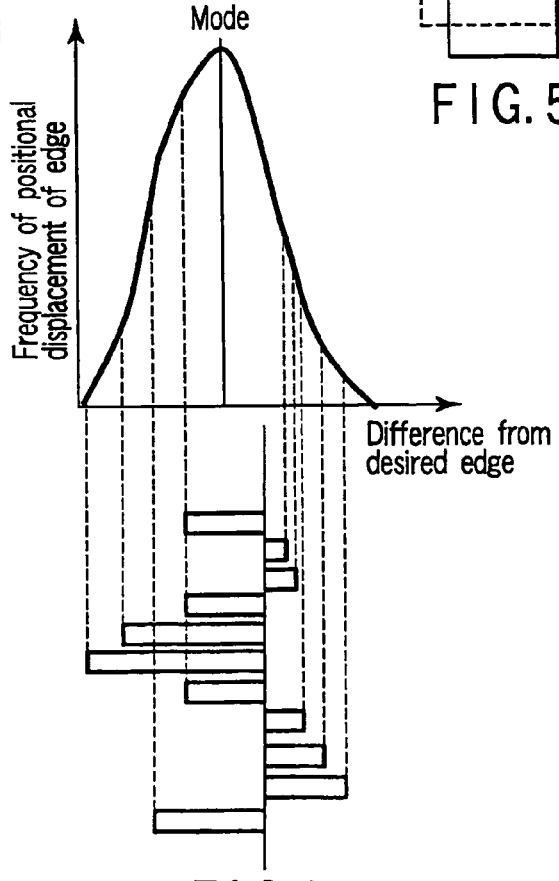
FIG. 7 is a graph illustrating the frequency distribution of positional displacements.

In this embodiment, the dispersion and the average value of positional displacements are used to determine if the mask pattern needs to be modified or not. However, it should be noted that the dispersion of positional displacements can be asymmetric depending on the parameter that is made variable. FIGS. 6 and 7 are illustrations that support the above description. In FIG. 6, the dispersion of positional displacements shows a normal distribution curve when a process parameter is made variable. In the case of normal distribution, the average and the mode agree with each other. On the other hand, in FIG. 7, the dispersion of positional displacements is asymmetric when a process parameter is made variable. In this case, the mode is used in place of the average to determine if the mask pattern needs to be modified or not.

While positional displacements of a pattern are computed in this embodiment, it is also possible to compute the mask error factor (MEF) in a similar manner. In this case, the parameters to be used for computing positional displacements are limited to those that relate to the mask. If the positional displacements are found to be greater than a predetermined value as a result of computations, the specification of the mask needs to be modified.

Similarly, when exposure parameters such as the NA, the partial coherence, the lighting profile, the wavelength of light for exposure and the resist parameter are changed, the changes are fed back to the lithography margin. When aligner parameters such as the aberration of the aligner and the transmission distribution of the lens are changed, the changes are fed back to the parameters of the aligner. When assist bar parameters are changed, the changes are fed back to the rules of the assist bar. In this way, when the feedback destinations need to be limited, it is possible to check the positional displacements by selecting the parameters that are to be made variable.

The manner of arranging evaluation points and the manner of generating patterns are not limited to those of this embodiment and may be defined in various different ways depending on the required level of accuracy and the limit of the processing time.

2nd Embodiment

Figure 8:
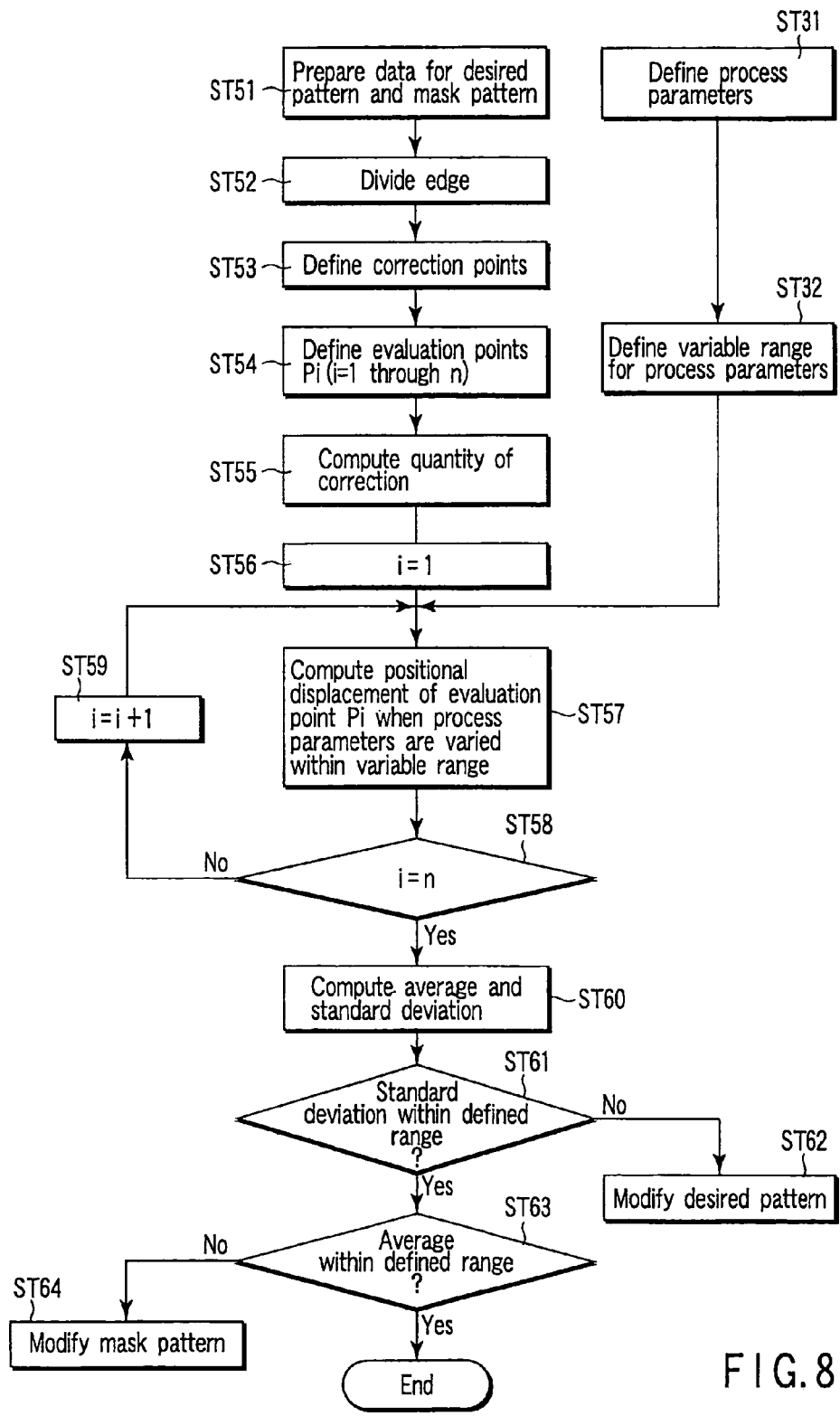
FIG. 8 is a flow chart summarily illustrating the sequence of a second embodiment of pattern verification method according to the invention.

In an experiment using this embodiment, each of the process parameters was made to be variable within a predefined range for a pattern obtained by carrying out an operation of optical proximity correction on a mask pattern, following the flow chart of FIG. 8 to check the positional displacements between the pattern to be generated on a wafer and the desired pattern on the wafer for parameter. Then, the dispersion and the average of all the positional displacements were determined. As a result, while the average was found within the predetermined range of the specification, the dispersion was found to be out of the predetermined range. Therefore, a recommended layout was output by following the sequence as described below to produce a desired pattern on a wafer.

FIG. 8 is a flow chart summarily illustrating the sequence of the second embodiment of pattern verification method according to the invention. FIGS. 9A through 9E are illustrations of the second embodiment of pattern verification method according to the invention.

Figure 9A:
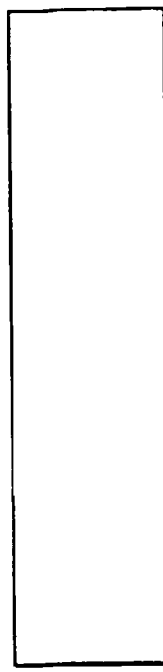
FIGS. 9A through 9E are illustrations of the second embodiment of pattern verification method according to the invention.

Firstly, draft circuit pattern data that are necessary for securing the device characteristics when designing an LSI or the like are prepared. Data for a mask pattern that is an enlarged draft circuit pattern are also prepared by taking the scale reduction ratio of the projection optical system of the aligner (Step ST51). FIG. 9A illustrates a desired pattern 10 on a substrate.

Figure 9B:
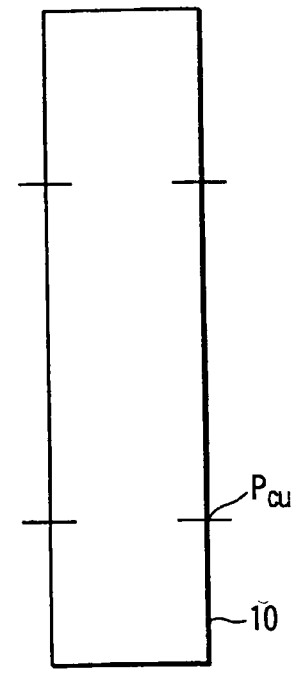

Then, dividing points $P_{cu}$ are defined to divide the mask pattern into parts having a predetermined length as shown in FIG. 9B (Step ST52).

Figure 9C:
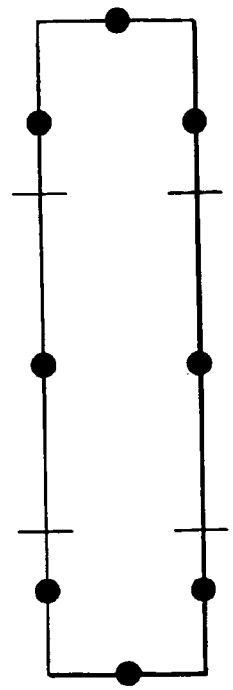

Then, as shown in FIG. 9C, correction points $P_{co}$ are defined at predetermined positions on the divided edges (Step ST53). Alternatively, dividing points $P_{cu}$ and correction points $P_{co}$ may be directly defined on the edges of the mask pattern.

Thereafter, an operation of optical proximity correction is conducted on the edge of the mask pattern that corresponds to each (of the divided parts?) of the defined edges (Step ST54). In Step ST54, the correction quantity is computed on each of the defined correction points and the corresponding edge of the mask pattern is shifted by the computed correction quantity.

Figure 9D:
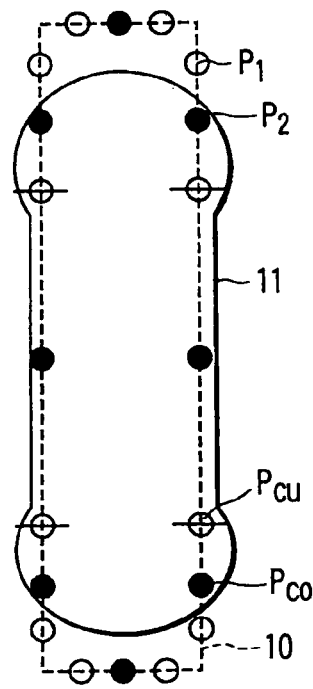
Figure 9E:
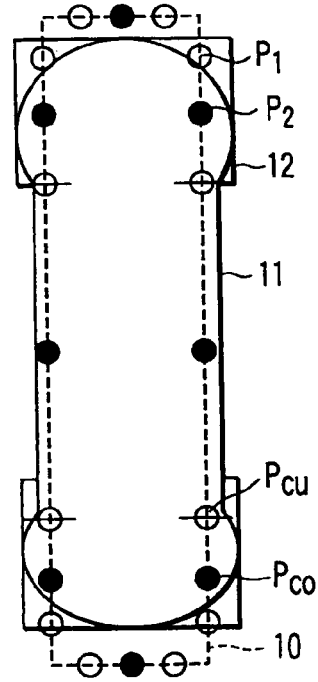

Then, as shown in FIG. 9D, n evaluation points $P_i$ (i=1 through n) are defined on the edges of the desired pattern 10 (Step ST55).

Process parameters that can give rise to positional displacements of pattern edges are defined (Step ST21). The process parameters may include the film thickness of the resist film, the numerical aperture NA, the dose and the parameters for exposure including the defocusing value as well as post-exposure parameters such as the PEB temperature and the development time. Then, a variable range is defined for each process parameter (Step ST22). In this embodiment, the variable range of the dose is defined in terms of under dose~the best dose~over dose. The variable range of the focus position is defined in terms of the best focus~defocus. The process parameters other than the dose and the focus position are made invariable from the defined values.

Then, the positional displacement is determined for each of all the defined evaluation points (Step ST56 through ST59). The method for determining the positional displacement is identical with that of the first embodiment and hence will not be described any further here.

The average and the standard deviation of the positional displacements of all the evaluation points $P_i$ (i=1 through n) are computed (Step ST60). Then, it is determined if the standard deviation of the positional displacements is found to be within a predefined range or not (Step ST61).

If the standard deviation is found to be out of the predefined variable range, the desired pattern has to be modified (Step ST62). The largest positional displacement of the edges is extracted out of all the positional displacements of the edges computed for the evaluation points on the desired pattern that has been divided and then another pattern 12 is generated with edges shifted from those of the desired pattern by the largest positional displacements (FIG. 9E) and a pattern is generated with edges shifted in opposite directions by the amounts obtained by dividing the extracted largest positional displacements by the MEF (mask error factor, or the ratio of the dimensional change relative to the variance of the mask).

In other words, it is possible to form a desired pattern on a wafer by modifying the draft layout according to the output layout or provide a design guideline.

If the standard deviation of the positional displacements is found to be within the predefined range, it is determined if the average of the positional displacements is found to be within the predefined range or not (Step S63). If the average of the positional displacements is found to be out of the predefined range, the corrected mask pattern needs to be modified (Step ST64).

If a plurality of evaluation points are used on the desired pattern in Step ST55, the same X coordinate and the same Y coordinate can be shared by more than one evaluation points because evaluation points are arranged linearly. Thus, it is only necessary to carry out the computation of inverse Fourier transformation that involves a heavy computational load for acquiring an optical image only once for an evaluation point because the result of the computation can be referred to for all the remaining evaluation points. In other words, the computational load of this embodiment does not rise significantly if the number of evaluation points is increased to raise the level of accuracy of evaluation.

FIGS. 9A through 9E schematically illustrate edges shifted by means of lithography simulation, using the technique of this embodiment, relative to a desired pattern. The evaluation points illustrated in the drawings are generated at positions with respective coordinates that are specified in advance and arranged at dividing points and separated from the respective corners by 100 μm.

FIG. 10 shows the results of an operation of generating patterns near an edge of a desired pattern by varying the process parameter within a predetermined range, using the technique of this embodiment. In FIG. 10, reference symbol 21 denotes the optical image obtained as a result of a transfer simulation conducted with a reference exposure level and under the best focus condition and reference symbol 22 denotes the optical image obtained as a result of a transfer simulation conducted with an exposure level energetically higher than the reference exposure level and under the defocus condition of 0.2 μm, whereas reference symbol 23 denotes the optical image obtained as a result of a transfer simulation conducted with an exposure level energetically lower than the reference exposure level and under the defocus condition of 0.2 μm. Additionally, in FIG. 10, reference symbol 24 denotes the pattern generated within the area of the divided desired pattern at a position with the largest positional displacement of edge among the positional displacements including those of the result of the transfer simulation with an exposure level energetically higher than the reference exposure level and under the defocus condition of 0.2 μm and those of the desired pattern and reference symbol 25 denotes the pattern generated within the area of the divided desired pattern at a position with the largest positional displacement of edge among the positional displacements including those of the result of the transfer simulation with an exposure level energetically lower than the reference exposure level and under the defocus condition of 0.2 μm and those of the desired pattern. From the obtained results, it was found that the largest absolute value and the sign can be obtained from the positional displacements of the desired pattern and those of the optical images obtained by the transfer simulations for all divided desired patterns.

FIG. 11 shows the results of displaying the recommended pattern obtained in Step ST62. In FIG. 11, reference symbol 33 (solid lines) denotes the layout illustrating a desired pattern on a wafer and reference symbol 32 (broken lines) denotes the layout illustrating the extent of the largest error, whereas reference symbol 31 (dotted chain line) denotes the recommended layout for forming a desired pattern on a wafer. In an experiment, it was possible to form a desired pattern on a wafer by drawing a layout of shifting the edges according to the obtained results.

As a result of another experiment using a conventional technique and the technique of this embodiment and common data for the same process, it was found that the conventional technique consumed 420 hours, whereas the technique of this embodiment consumed only 61 hours.

In this embodiment, three combinations including (the best dose/the best focus), (over dose/defocus) and (under dose/defocus) are used to compute the positional displacement of the edges. However, it is possible to compute for all possible combinations of doses and focuses simultaneously without any additional load. At the same time, it is also possible to compute the positional displacements that can be produced just like the defined dose, the defined focus, the process parameters, the numerical aperture of the aligner, the coherence factor, the center shielding ratio and/or the aberration change. Additionally, it is also possible to modify the mask pattern or redo the operation of proximity correction by comparing the dispersion and the average of the computed positional displacements. Furthermore, it is possible to use all or part of the parameters of the items that can participate in positional displacement and hence the parameters that are used in this embodiment are not limited to those listed above.

Figure 12:
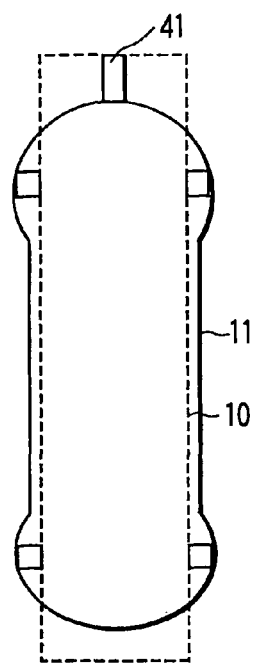
FIG. 12 is a schematic illustration of a method of displaying a marker that indicates the positional displacement of the edges when a single process parameter is used.
Figure 13:
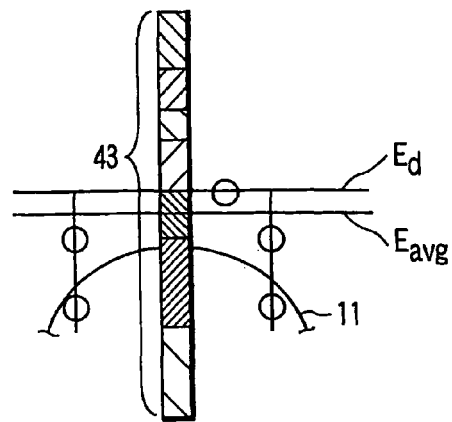
FIG. 13 is a schematic illustration of a method of displaying markers that respectively indicate the positional displacements of the edges when more than one process parameters are used.

FIG. 12 shows a method of displaying a marker that indicates the positional displacement when a single process parameter is used. FIG. 13 shows a method of displaying markers that respectively indicate the positional displacements when more than one process parameters are used. When a single process parameter is used, markers 41 are displayed at respective evaluation points to indicate so many positional displacements between the pattern obtained as a result of a transfer simulation and the mask pattern as shown in FIG. 12. When, on the other hand, more than one process parameters are used, different markers 43 are displayed and the dispersion and the average of all the markers are computed as shown in FIG. 13. In FIG. 13, Ed denotes the position of an edge of the desired pattern and Eavg denotes the average position of the positional displacements of the edge.

Figure 14:
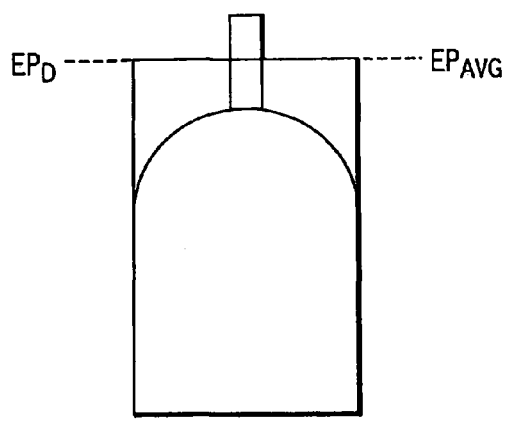
FIG. 14 is a schematic illustration of a concentration method used for correction.

While this embodiment is described for conducting an operation of optical proximity correction with the ordinary correction method, the use of optical proximity correction is not limited to the ordinary correction method and the verification method of this embodiment can be used for proximity correction by taking the lithography margin into consideration. Then, the technique of narrowing down the correction is different from the technique that is used with the conventional method, as shown in FIG. 14.

More specifically, an operation of proximity correction is conducted when the average of positional displacements and the displacement of a desired pattern are large. With the conventional method, the correction is narrowed down so as to make the results of a simulation and the desired edge positions agree with each other under optimal conditions of the device. On the other hand, when an operation of proximity correction is conducted with this embodiment by taking the lithography margin into consideration, the correction is narrowed down so as to make the average edge positions $EP_{AVG}$ obtained as a result of a simulation and the desired edge positions $EP_D$ agree with each other.

Figure 15:
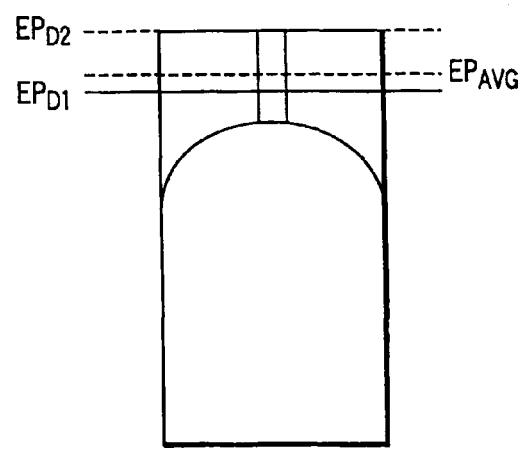
FIG. 15 is a schematic illustration of another concentration method used for correction.

Additionally, the verification method of this embodiment can be applied to a new desired pattern obtained by adding the transformation difference to a desired pattern. While the narrowed down position is that of the desired pattern under optimal conditions of the device with the conventional method, the narrowed down position is shifted to the edge position $EP_{D2}$ obtained by adding the transformation difference (FIG. 15) when a transformation difference is added thereto. However, the evaluation point may remain on the original desired edge position $EP_{D1}$ (before the transformation difference is added).

While positional displacements of a pattern are computed in this embodiment, it is also possible to compute the mask error factor (MEF) in a similar manner. In this case, the parameters to be used for computing positional displacements are limited to those that relate to the mask. If the positional displacements are found to be greater than a predetermined value as a result of computations, the specification of the mask needs to be modified. Similarly, when exposure parameters such as the numerical aperture NA, the partial coherence, the lighting profile, the wavelength of light for exposure and the resist parameter are changed, the changes are fed back to the lithography margin. When aligner parameters such as the aberration of the aligner and the transmission distribution of the lens are changed, the changes are fed back to the parameters of the aligner. When assist bar parameters are changed, the changes are fed back to the rules of the assist bar. In this way, when the feedback destinations need to be limited, it is possible to check the positional displacements by selecting the parameters that are to be made variable.

The manner of arranging evaluation points and the manner of generating patterns are not limited to those of this embodiment and may be defined in various different ways depending on the required level of accuracy and the limit of the processing time.

3rd Embodiment

As patterns are micronized, the precision level of corners may need to be raised particularly when computing the positional displacements of edges by means of the first or second embodiment. A technique (a spline technique) of computing a positional displacement that is different from Step ST14 of the first embodiment and Step ST57 of the second embodiment is used in this embodiment. This will be described below.

A reference light intensity is defined. A number of auxiliary evaluation points are automatically defined in a direction perpendicular to an edge for the evaluation points defined on the edge. The automatically generated auxiliary evaluation points are found within an area extended from a point on the edge of the desired pattern by 30 nm to the opposite lateral sides. A total of 6 evaluation points are added at regular intervals of 10 nm. These evaluation points are selected as tradeoff with the processing speed. In an experiment conducted for this embodiment, the area for generating evaluation points and the intervals of evaluation points were made to vary in order to find out conditions that make the difference between the edge position of an optical image and that of the desired pattern at each evaluation point selected by the conventional method not exceeding 1 nm.

The light intensity of each of the evaluation points and that of each of the auxiliary evaluation points are determined. Then, the light intensity at a point between any two adjacently located evaluation points is determined by interpolation and the positional coordinate $t_2$ of the point whose light intensity is determined by interpolation so as to be used as reference light intensity is computed by means of the spline method. Then, $t_2-t_1$ is defined as positional displacement.

The above-described method of computing the positional displacement is applied to the second embodiment to obtain a recommended pattern. Since the obtained recommended pattern is similar to the one obtained in the above description of the second embodiment, it will not be described here. However, the difference between this embodiment and the second embodiment is clear by comparing the positional displacements of all the evaluation points of this embodiment with those of the second embodiment.

Figure 16A:
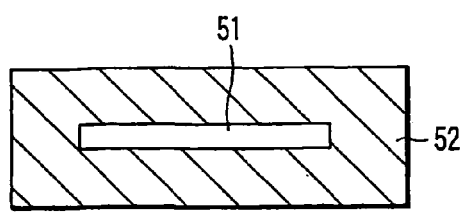
FIGS. 16A and 16B are schematic illustrations of a pattern that can be used for a third embodiment of the invention.
Figure 16B:
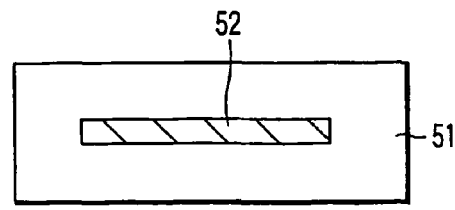

In an experiment, patterns same as the one evaluated by means of the first embodiment were evaluated by means of the spline method and compared with the desired pattern for positional displacements. The patterns that were evaluated have a rectangular profile having a long side of 1 μm and a short side of 0.09 μm. Masks of two different types, one with a dark field and the other with a bright field, were prepared. FIGS. 16A and 16B schematically illustrate the patterns. FIG. 16A shows the dark field mask and FIG. 16B shows the bright field mask. In FIGS. 16A and 16B, reference symbol 51 denotes an aperture and reference symbol 52 denotes a shield.

An operation of optical proximity correction was conducted on these masks. The exposure conditions included the dose wavelength: 193 nm, the numerical aperture (NA): 0.75, the coherence factor (σ): 0.85, the use of 2/3 annular illumination (shielding ratio of center of illumination) and reference dose $I_{th}$=0.218. Then, the positional displacements between the edges of the pattern formed on a wafer by using the masks after the correction, taking a development model into consideration, and those of the desired pattern were computed.

FIG. 16A shows the pattern obtained by using the dark field mask (the inside of the edges is an aperture and the surrounding of the edges is a shield) and FIG. 16B shows the pattern obtained by using the bright field mask (the inside of the edges is a shield and the surrounding of the edges if an aperture).

Figure 17:
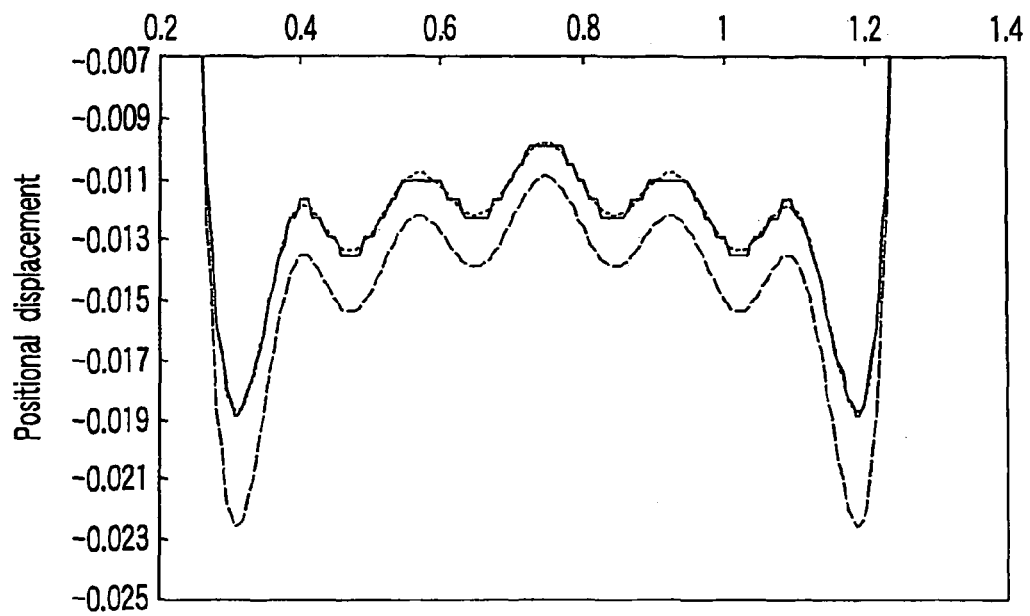
FIG. 17 is a graph illustrating the positional displacements under the best focus/best dose conditions.

FIG. 17 is a graph illustrating the positional displacements under the best focus/best dose conditions. In FIG. 17, the solid line, the broken line and the dotted line respectively indicate the positional displacements determined by the spline method, the slope method and the conventional method (light intensity is calculated by Hopkins's equation). From FIG. 17, it will be seen that the positional displacements determined by the spline method substantially agree with those determined by the conventional method including the corners (the opposite ends of the X-axis).

Figure 18:
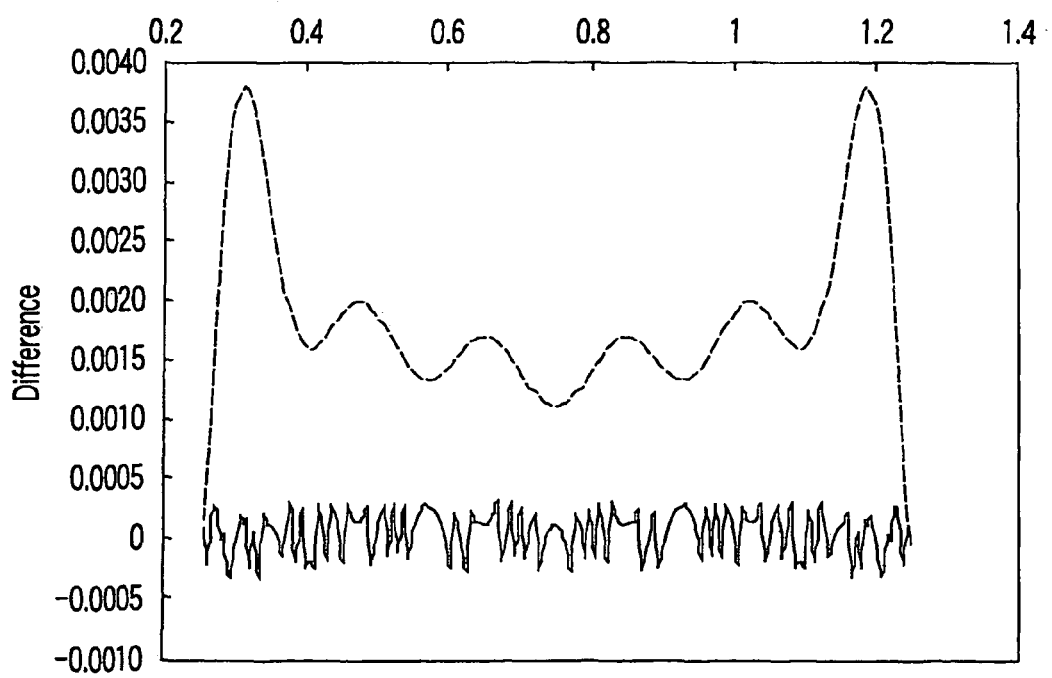
FIG. 18 is a graph illustrating the differences between the conventional method and the slope method and the differences between the spline method and the conventional method under the best focus/best dose conditions.

FIG. 18 is a graph illustrating the differences (broken line) between the conventional method and the slope method and the differences (solid line) between the spline method and the conventional method under the best focus/best dose conditions. It will be seen from FIG. 18 that the differences between the spline method and the conventional method are small.

FIG. 19 is a graph illustrating the positional displacements under the defocus/best dose conditions. In FIG. 19, the solid line, the broken line and the dotted line respectively indicate the positional displacements determined by the spline method, the slope method and the conventional method. FIG. 20 is a graph illustrating the differences (broken line) between the conventional method and the slope method and the differences (solid line) between the spline method and the conventional method under the defocus/best dose conditions. It will be seen from FIG. 20 that the differences between the spline method and the conventional method are small. Even under the defocused condition the differences between the spline method and the conventional method are small.

FIGS. 21 through 24 illustrates the results obtained by changing the mask pattern to a bright pattern. In these graphs, it will be seen that the results obtained by the spline method show smaller differences than those obtained by the conventional method.

Figure 21:
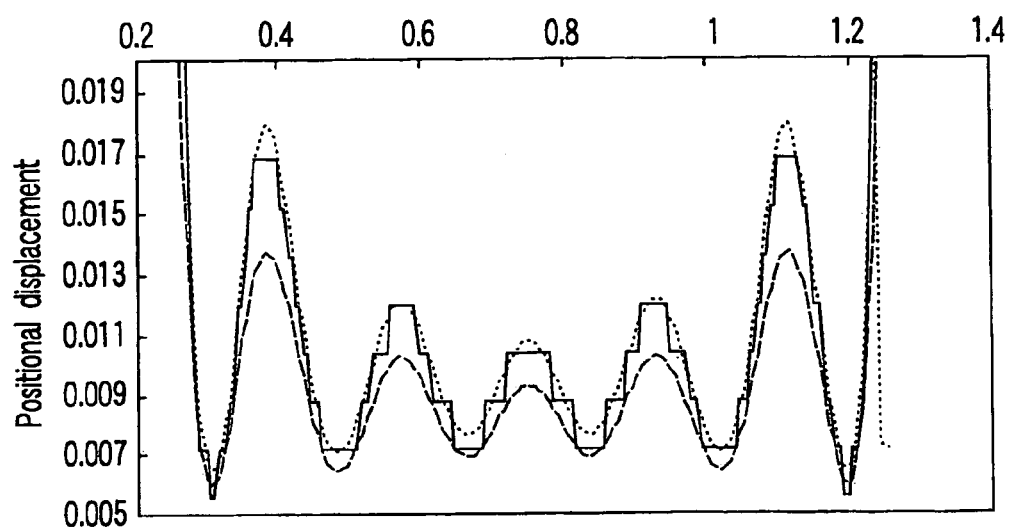
FIG. 21 is a graph illustrating the positional displacements under the best focus/best dose conditions.
Figure 22:
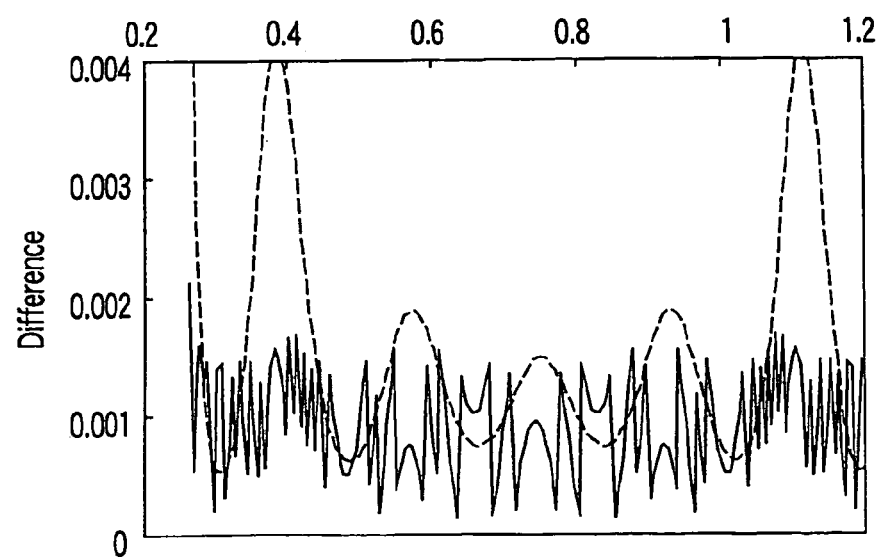
FIG. 22 is another graph illustrating the differences between the conventional method and the slope method and the differences between the spline method and the conventional method under the best focus/best dose conditions.
Figure 23:
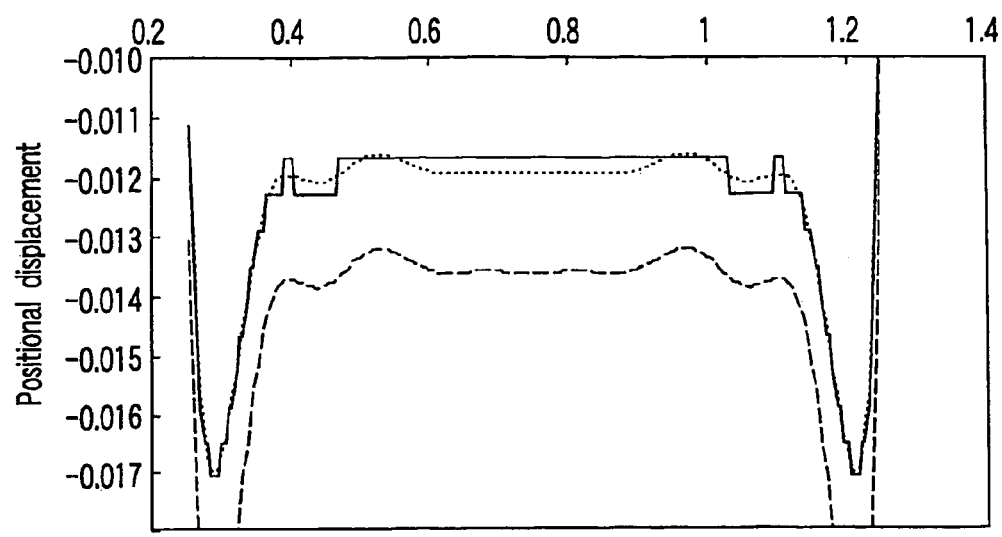
FIG. 23 is a graph illustrating the positional displacements under the defocus/best dose conditions.
Figure 24:
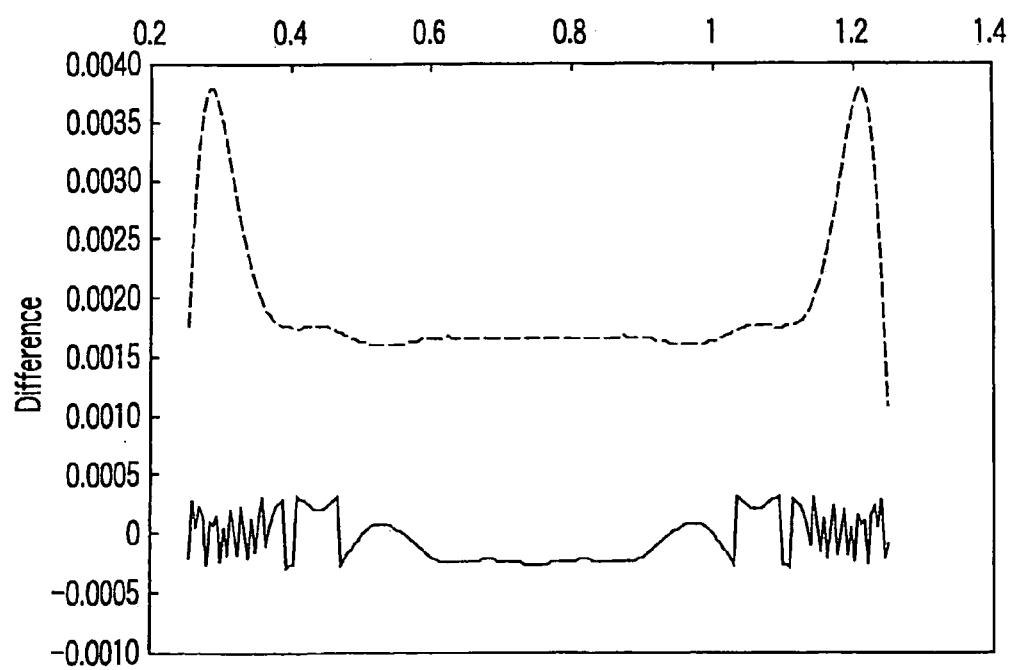
FIG. 24 is a graph illustrating the differences between the conventional method and the slope method and the differences between the spline method and the conventional method under the defocus/best dose conditions.

FIG. 21 is a graph illustrating the positional displacements under the best focus/best dose conditions. FIG. 22 is a graph illustrating the differences between the conventional method and the slope method and the differences between the spline method and the conventional method under the best focus/best dose conditions. FIG. 23 is a graph illustrating the positional displacements under the defocus/best dose conditions. FIG. 24 is a graph illustrating the differences between the conventional method and the slope method and the differences between the spline method and the conventional method under the defocus/best dose conditions.

In FIGS. 21 and 23, the solid line, the broken line and the dotted line respectively indicate the positional displacements determined by the spline method, the slope method and the conventional method. In FIGS. 22 and 24, the broken line indicates the differences between the conventional method and the slope method and the solid line indicates the differences between the spline method and the conventional method.

In this embodiment, three combinations including (the best dose/the best focus), (over dose/defocus) and (under dose/defocus) are used to compute the positional displacement of the edges. However, it is possible to compute for all possible combinations of doses and focuses simultaneously without any additional load. At the same time, it is also possible to compute the positional displacements that can be produced just like the defined dose, the defined focus, the process parameters, the numerical aperture of the aligner, the coherence factor, the center shielding ratio and/or the aberration change. Additionally, it is also possible to modify the mask pattern or redo the operation of correction by comparing the dispersion and the average of the computed positional displacements. Furthermore, it is possible to use all or part of the parameters of the items that can participate in positional displacement and hence the parameters that are used in this embodiment are not limited to those listed above.

4th Embodiment

Figure 25:
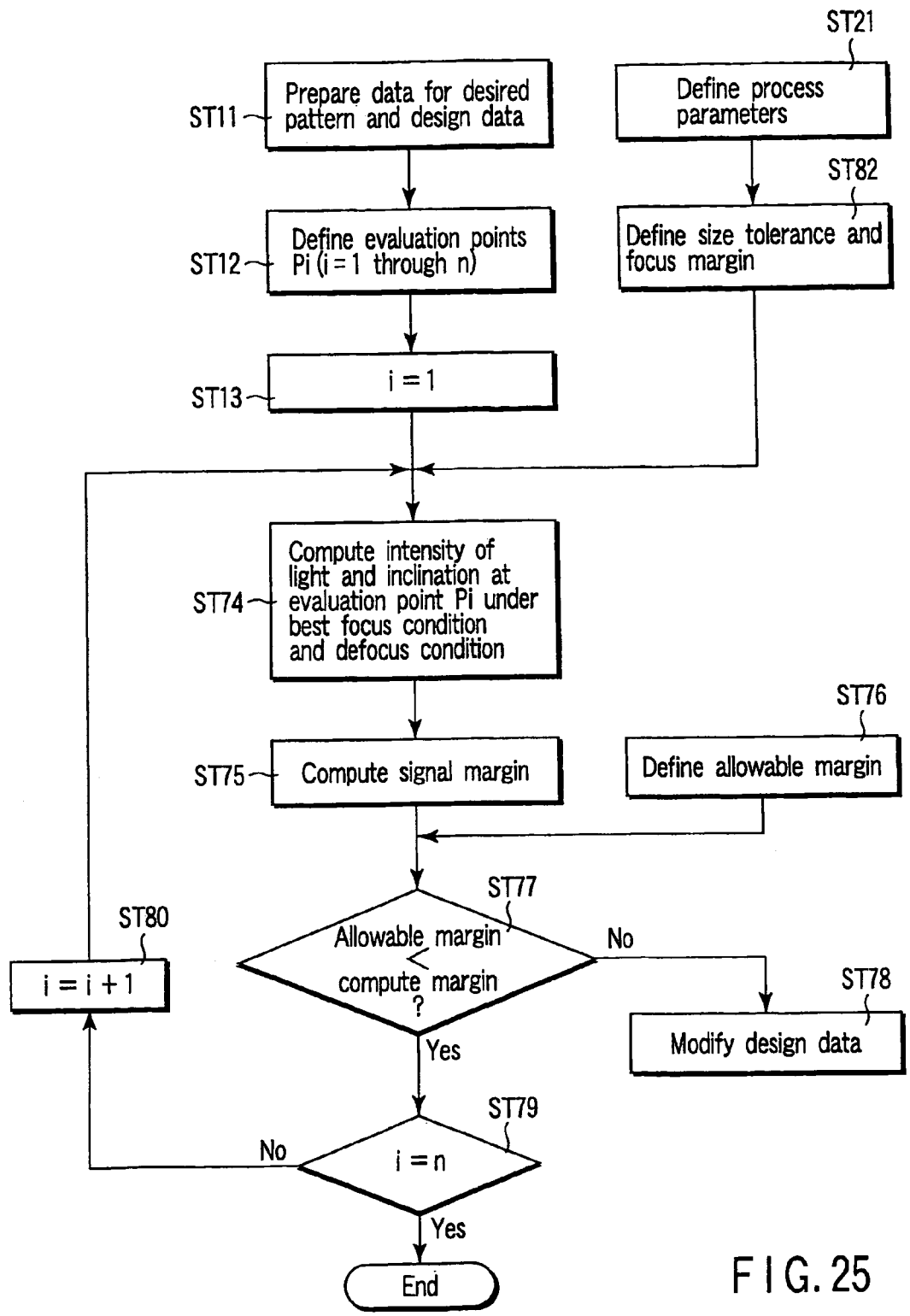
FIG. 25 is a flow chart summarily illustrating the sequence of a fourth embodiment of pattern verification method according to the invention.

This embodiment provides a technique of determining the light intensity (log dose) on a desired pattern edge on a wafer and the slope of the light intensity within the range of a predetermined focus margin for a layout and verifying the pattern by using the processing sequence as illustrated in the flow chart of FIG. 25.

FIG. 25 is a flow chart summarily illustrating the sequence of the fourth embodiment of pattern verification method according to the invention. In FIG. 25, the steps same as those of the flow chart of FIG. 1 are denoted respectively by the same reference symbols and will not be described any further. This embodiment will be described also by referring to the ED-tree of FIG. 26.

In an experiment using this embodiment, a layout of a 90 nm line and space (LS) pattern was used. The light intensity after the exposure and development process was computed under the predetermined conditions including of the dose wavelength: 193 nm, NA: 0.75, σ: 0.85 and ϵ: 0.67.

The size tolerance and the focus margin (defocus value) are defined (Step ST82). In the case of this embodiment, the defocus value is 0.15 μm when a size tolerance of 0.01 μm is given.

The light intensity and the slope of the function expressing the light intensity are computed under the two conditions of the best focus condition and the defocus condition (Step ST74), in a manner as described below.

As in the case of the first embodiment, the light intensity $I(t_1)$ at the evaluation point $P_t$ with the positional coordinate $t_1$ on the desired pattern 1 is computed by using the Hopkins formula (formula (1)).

$$I(t) = \int\int_{-\infty}^{\infty} TCC(\omega,\omega') \times M(\omega) \times M(\omega')^* \times \exp\{i(\omega-\omega')t\}d\omega d\omega' \quad (1)$$

Then, the differential quotient $I'(t_1)$ of the first derivative (slope) of the light intensity $I(t_1)$ at the evaluation point 11 with the coordinate $t_1$ is computed by using formula (2) below.

$$I'(t) = \int\int_{-\infty}^{\infty} TCC(\omega,\omega') \times M(\omega) \times \quad (2)$$
$$M(\omega')^* \times i(\omega-\omega') \times \exp\{i(\omega-\omega')t\}d\omega d\omega'$$

The values obtained on the desired pattern edge include the light intensity (log dose): 0.2182069 and the slope: 1.819103 under the best focus condition and the light intensity (log dose): 0.217902 and the slope: 1.605271 under the defocus condition (0.15 μm defocus). The difference of exposure between the best focus condition and the defocus condition is 0.0003049.

On the other hand, when the size tolerance and the slope are given, the dose margin that is allowed when forming an edge within the size tolerance is given by the formula of dose margin=light intensity(log dose) [non-dimensional]+slope[1/μm]×size[μm].

Thus, the dose margin is computed by using the slope and the size tolerance determined under the best focus condition and those determined under the defocus condition.

As for the best focus, the dose margin $DM_b$ is 0.0182 when an slope of 1.819103 and a size tolerance of 0.01 μm are given.

A value of 8.56% is obtained by transformation into the ratio relative to the reference light intensity $I_{th}$ (threshold value for forming edges of a pattern) of 0.201089 as given in the first embodiment.

As for the defocus, the dose margin $DM_d$ is 0.0161 when an slope of 1.605271 and a size tolerance of 0.01 nm are given. A value of 7.98% is obtained as ratio relative to the reference light intensity.

From these values, the single dose margin $DM_s$ of this layout is determined. A single dose margin $DM_s$ is defined by the formula below.

single dose margin={smaller of dose margin $DM_b$ and dose margin $DM_d$}−(value obtained by reducing the difference D between light intensity for best focus and light intensity for defocus to dose margin)

From the above formula, the single dose margin $DM_S$ is computed to obtain 7.97% from 7.89%−0.01452% (by reducing difference=1.819103−1.605271=0.000305 to dose margin, using reference light intensity 0.201089) (Step ST77). The dose margin of this layout as determined by the conventional method is 7.75%. Therefore, the two values substantially agree with each other.

The dose margin that is allowed to the layout as determined in Step ST76 is 7%. It is possible to judge if the necessary margin is provided for the layout at a desired edge or not by comparing the dose margin (allowable margin) and the dose margin determined by this embodiment (computed margin) (Step ST77). In the case of a 90 nm LS pattern, it is judged that the necessary margin is provided and the processing operation proceeds to process the next evaluation point (Step ST79, Step ST80).

The same processing operation was carried out for an 85 nm LS pattern. The obtained values include the light intensity: 0.2182099 and the slope: 1.450778 under the best focus condition and the light intensity: 0.2178164 and the slope: 1.3636 under the defocus condition. The dose margin determined on the basis of these results as in the case of 90LS was 6.63% and it was judged that the value of 7% of the specification had not been achieved and hence the layout had to be modified. Information on the necessary modification of the layout is then output (Step ST78).

FIG. 27 is a graph illustrating the results of an operation of determining the margin of the same layout by means of the conventional method and also by means of the method of this embodiment. It will be seen that they agree with each other to a considerably extent.

When determining the margin by the conventional method, the sizes at three points including the evaluation point and the two size tolerance points are computed under the best focus condition and also under the defocus condition. Therefore, a total of six computations are required for the light intensity. To the contrary, with the method of this embodiment, it is only necessary to compute the light intensity and the slope at two points including the evaluation point under the best focus condition and the evaluation point under the defocus condition.

In the formulas (1) and (2), the part of $\exp(i(\omega-\omega')t)$ requires a large computational load. However, in the case of this embodiment, it is possible to refer to the result of computation obtained at the time of determining the light intensity at the reference point when determining the slope by using the formula (2) and hence it is not necessary to compute that part once again. The ratio of the time necessary for simply referring to the result of computation of $\exp(i(\omega-\omega')t)$ to the time necessary for computing $\exp(i(\omega-\omega')t)$ is 1:10. Therefore, the ratio of the time necessary for the computations of the six items to the time necessary for computing the two items and their respective slopes is 6:2.2. In other words, the computing time is reduced to about ⅓. Thus, as a result, it is possible to improve the TAT of the verification.

5th Embodiment

In an experiment using this embodiment, the dose margin was determined by carrying out computations same as those of 1st Embodiment for a 90 nm isolated (ISO) pattern. The obtained values include the light intensity: 0.2164658 and the slope: 3.321888 under the best focus condition and the light intensity: 0.2005 and the slope: 3.142987 under the defocus condition. The single dose margin determined on the basis of these results was 7.6%. The dose margin required for this layout is 7% and hence it was judged that the necessary margin is provided and the processing operation proceeded to the next step.

In another experiment, the obtained values include the light intensity: 0.2184965 and the slope: 3.307209 under the best focus condition and the light intensity: 0.241642 and the slope: 3.132345 under the defocus condition. The margin determined on the basis of these results was 4.06% and it was judged that the value of the specification had not been achieved and hence the layout had to be modified. Information on the necessary modification of the layout is then output.

The operation of verifying the layout, for which a single dose margin is provided, can be made to proceed by combining the result of determining the single dose margin of the fourth embodiment and that of the fifth embodiment. More specifically, both the 90LS pattern and the 90ISO pattern are provided with a single dose margin. The value of the single dose margin of 90LS, that of 90ISO and the difference of the exposures under the best focus condition may be used for discussing a common margin for them.

The difference of the exposures under the best focus condition corresponds to a margin of (0.2184658−0.2182069/0.201989=0.12%. The common margin is 7.6+0.12=7.72% and hence satisfies the requirement of the specification, which is 7%. If it is smaller than 7%, information on the necessary OPC modification is output.

A typical layout for products is used to determine the margin and verify the pattern by the fourth and the fifth embodiments. However, the present invention is by no means limited to specific patterns described above for the preferred embodiments and the present invention can be used to verify various layouts. The dose conditions are not limited to those described above for the preferred embodiments and may be defined appropriately according to the target layout.

When the margin is provided by the specification, the layout can be verified by seeing if the slope of each evaluation point is found within the allowable limits of slope or not by using
minimal value of slope=Δlight intensity/ΔCD and Δlight intensity=the change in the dose within the expected dose margin.

6th Embodiment

The fourth and fifth embodiments are effective when a mask that is subjected to proximity correction is used for a pattern. When the light intensity (I) of the pattern and the reference light intensity ($I_{th}$) of the device are relatively close to each other, it is possible to approximate the slope at the position of the reference light intensity $I_{th}$ by using the slope of the light intensity at the evaluation point. However, if they are not close to each other, the slope of light intensity is not necessarily continuous and the approximation may involve an error. If such is the case, the exposure margin can be determined by computing the difference between the light intensity at the auxiliary point obtained by moving the reference point by the size tolerance and the light intensity at the reference point and determining the ratio of the difference to the reference light intensity.

In this embodiment, the exposure margin determined by the above-described method is used as index for judgment on the pattern. In an experiment, this technique was applied to the 85 nm L/S pattern described above by referring to the fourth embodiment. Firstly, as for the best focus margin, the light intensity at the evaluation point was 0.218099 and the light intensity at the auxiliary point (evaluation point+4.25 nm) was 0.204726. By using the difference of these values and the reference light intensity of the device, or 0.201089, the best focus margin was determined to be (0.218099−0.211412)/0.201089×100=3.325%. Since this value is equal to the value that is obtained by moving by a half of the size tolerance, the value obtained by moving in opposite directions is 3.325×2=6.65%.

Similarly, as for the defocus margin, the light intensity at the evaluation point was 0.2178164 and the light intensity at the auxiliary point was 0.21116. The margin determined as in the case of the best focus margin was 6.62%. The single dose margin as obtained by determining the ratio of the difference of the light intensity for the best focus and the light intensity for the defocus to the reference light intensity, or 0.14%, was 6.48%. Thus, it was judged that the value of 7% of the specification had not been achieved and hence the layout had to be modified. Information on the necessary modification of the layout is then output.

7th Embodiment

Figure 28:
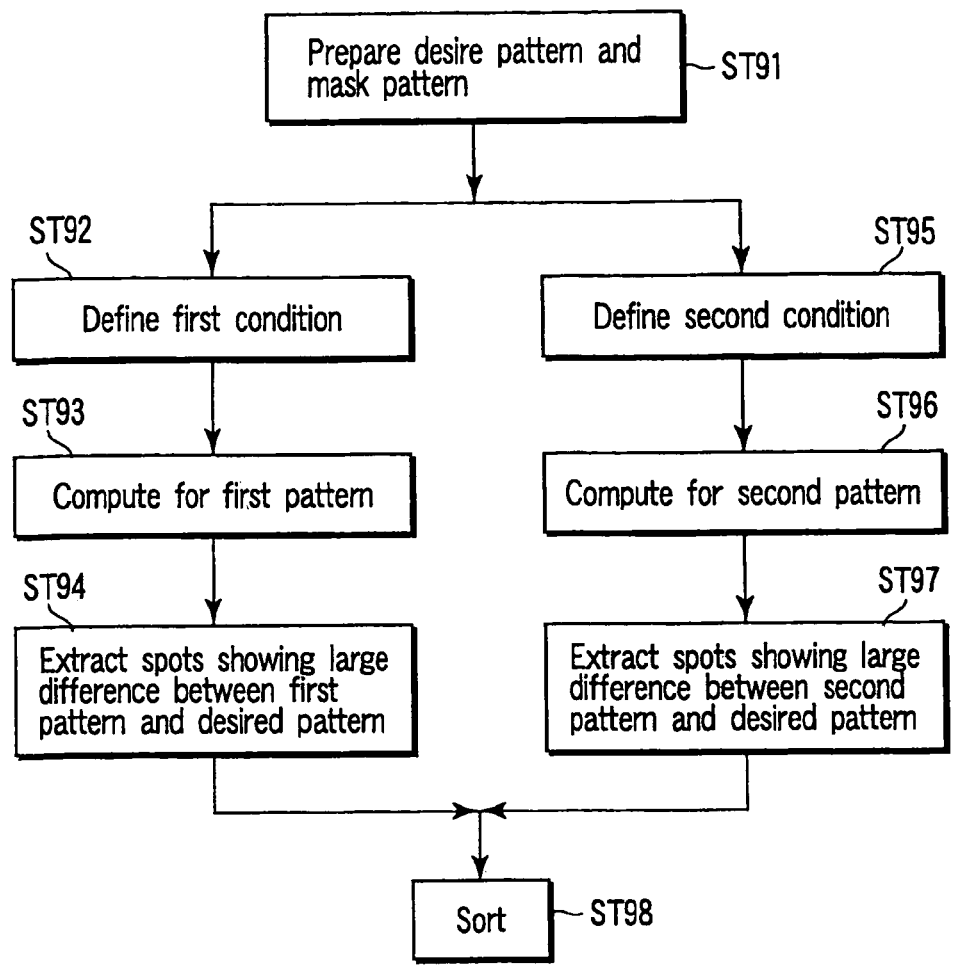
FIG. 28 is a flow chart summarily illustrating the sequence of a seventh embodiment of pattern verification method according to the invention.

FIG. 28 is a flow chart summarily illustrating the sequence of the seventh embodiment of pattern verification method according to the invention.

Figure 29A:
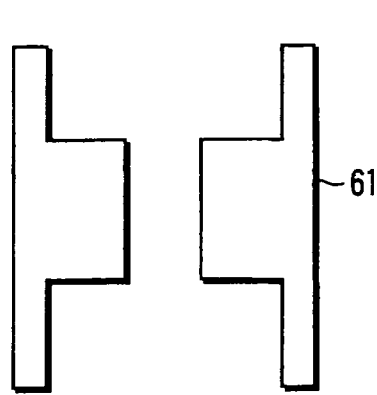
FIGS. 29A and 29B are schematic illustrations of a desired pattern and a corresponding mask pattern.
Figure 29B:
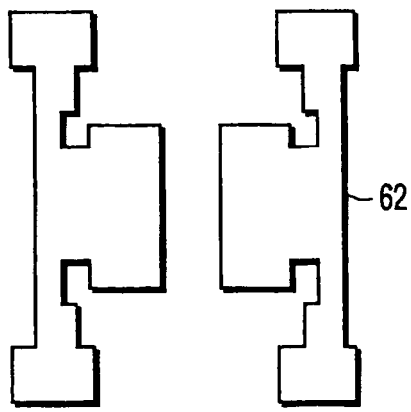

Firstly, a desired pattern 61 (FIG. 29A) and a mask pattern 62 (FIG. 29B) that has been subjected to proximity correction in order to form the desired pattern on a substrate are prepared (Step ST91). The mask pattern has been subjected to optical proximity correction and/or process proximity correction.

Conditions (first conditions) are defined for the integrated circuit pattern data (Step ST92). A simulation is conducted under the first conditions to determine the profile of the first pattern to be formed on a processing substrate (Step ST93). FIG. 30A illustrates the pattern 71 obtained by the simulation. It is assumed that an aligner with illuminating condition ArF is used for the integrated circuit and the pattern is transferred under the conditions of NA=0.75, σ=0.85 and ε=⅔ and in this embodiment.

Then, the profile of the desired pattern on the processing substrate and the profile of the pattern formed on the processing substrate as determined by the above described simulation are compared and the spots showing a large difference are extracted (Step ST94). A large difference may be defined as 10% of the smallest line width and the space permitted by the design rules or 10% of the design size of the selected spot. This sequence is identical with the sequence of the conventional simulation for extracting spots showing a large difference between the profile of the desired pattern and the profile of the pattern obtained by simulation. In FIG. 30A, reference symbol 72 denotes a polygon that indicates a spot where the difference is large. Such a spot is output in the form of a polygon that is an error mark contained in the integrated circuit pattern data.

Then, the second conditions that are different from the first conditions including NA=0.75, σ=0.85 and ε=⅔ ann, defocus value=0.1 μm and +5% dose are defined for the same integrated circuit pattern data (Step ST95). A simulation is conducted under the second conditions to determine the profile to be produced on the processing substrate (Step ST96). FIG. 30B illustrates the pattern 72 obtained by the simulation.

While the first conditions and the second conditions differ in terms of focus and dose in this instance, factors that can produce differences of conditions may include 1) focus, 2) dose, 3) aberration, 4) illumination profile, 5) illumination conditions and 6) resist type.

Then, as in the case of the first conditions, the profile of the desired pattern 61 on the processing substrate and the profile of the pattern 72 formed on the processing substrate as determined by the above described simulation are compared and the spots showing a large difference are extracted (Step ST97). In FIG. 30B, the spots 82 and 83 showing a large difference are indicated by respective polygons 82.

Then, the spot extracted solely under the first conditions, the spot 83 extracted solely under the second conditions and the spots 81, 82 extracted under the first and second conditions are sorted by comparing the spots extracted under the first conditions and those extracted under the second conditions (Step ST98).

For instance, the first conditions include NA=0.75, σ=0.85 and ε=⅔ ann, defocus value=0 μm and the second conditions include NA=0.75, σ=0.85 and ε=⅔ ann, defocus value=0.1 μm and +5% dose, the spot extracted under solely under the first conditions and the spots extracted under the first and second conditions indicate that the "optical proximity correction per se" or the "integrated circuit pattern data per se" is problematic. The spot extracted solely under the second conditions indicate that the "optical proximity correction" per se is not problematic and the dose margin itself is small so that some measures have to be taken.

As described above, it is possible to tell whether the difference between the pattern profile and the desired pattern profile is attributable to the desired pattern or to the process conditions by determining the pattern profile formed on the substrate by means of a mask pattern under a plurality of process conditions, extracting spots showing a large difference between the determined pattern profile and the desired profile and sorting the extracted spots according to the pattern conditions.

No new computer program has to be developed for the comparison. For the purpose of the present invention, it is possible to use a commercially available tool (DRC) for confirming the design rules including one defining the width of the layout. While it is possible to acquire pattern XOR output in the form of a polygon, the format of polygon can vary "slightly" from tool to tool so that it may be necessary to conduct an ambiguous retrieval operation. While ambiguity may be defined in various different ways, it may for example be so defined that the total sum of the differences of the sides of polygons is not greater than the maximum correction unit that is selected at the time of OPC if "the number of corners is same" and "the length of each side of the polygons" is small.

8th Embodiment

Now, the eighth embodiment of the present invention, which includes a pattern verification computer program and a pattern verification system, will be described below by referring to FIG. 28.

Referring to FIG. 31, the pattern verification system 100 comprises a computer 101 that performs arithmetic operations and controls various components of the system, a memory section 102 for storing the outcome of arithmetic operations, a verification computer program and so on, an input section 103 to be used for inputting various input data, a storage medium input/output section 104 to be used for writing the verification computer program from the storage medium such as optical disk that stores the verification comparator program prepared by some other computer, draft circuit pattern and data for a mask pattern into the memory section 102 and a display section 105 for displaying the input/output information and the outcome of arithmetic operations. A verification computer program for executing any of the above-described first through sixth embodiments of pattern verification method is installed in the edge positional displacement verification system 100.

The verification program is input to the storage section 102 typically by the user watching the display section 105 and operating the input section 103, which may be a keyboard. If the verification computer program is prepared by some other computer, it may be input to the computer 101 and stored in the storage section 102 by way of a storage medium such as optical disk and the storage medium input/output section 104.

The verification computer program can be executed as the user retrieves it from the storage section 102 storing it to an operating section of the computer and inputs necessary data including data for initialization by way of the input section 103. As the arithmetic operations are completed, the obtained data on the positional displacements of the edges and the data necessary for modifying the design data are stored in the storage section 102 so that they may be displayed on the display section 105 and/or output to the printer (not shown) and/or to any of various storage mediums including disks of different types and semiconductor memories whenever necessary, from the storage medium input-output section 104.

While a stand-along verification system is described above, a pattern verification system according to the invention may be provided with a communication adaptor (not shown) or the like for connecting the system to a data processing network.

Mask can be manufactured by using a mask pattern verified by any of the pattern verification methods described in above embodiments or a recommended pattern obtained as a result of verification. It is also possible to conduct a lithography process for manufacturing semiconductor devices by using a manufactured mask.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A computer-implemented method of correcting a mask pattern design, the method comprising:
   preparing, by a computer, a desired pattern and a mask pattern to form a first transferred/formed pattern corresponding to the desired pattern on a substrate, the mask pattern comprising an edge;
   generating, by the computer, a plurality of edges by dividing the edge of the mask pattern by a predetermined length;
   defining a correction point on the plurality of edges to generate a plurality of correction points;
   computing, by the computer, a correction quantity in consideration of the proximity effect for the plurality of correction points to generate a plurality of correction quantities;
   forming, by the computer, a correction mask pattern by moving the plurality of edges according to the plurality of correction quantities, the correction mask pattern comprising an edge;
   defining at least one evaluation point on the edge of the correction mask pattern;
   defining at least one process parameter to form a second transferred/formed pattern which is either a resist pattern formed on the substrate by using the correction mask pattern or a pattern formed on the substrate by using the resist patterns as a mask;
   defining a reference value and a variable range for the at least one process parameter;
   generating, by the computer, a combination of parameter values by varying the at least one process parameter within the variable range;
   computing, by the computer, a positional displacement for the combination of the parameter values to generate a plurality of positional displacements, wherein the positional displacement is a positional displacement between at least one first point on the second transferred/formed pattern and the at least one evaluation point, and wherein the at least first point corresponds to the at least one evaluation point;

computing, by the computer, a statistic of the plurality of positional displacements;

outputting, by the computer, information to modify the mask pattern according to the statistic;

comparing the standard deviation of the positional displacements and a first predefined range;

changing the desired pattern provided in a case where the standard deviation of the positional displacement is out of the first predefined range;

comparing the average of the positional displacements and a second predefined range provided in a case where the standard deviation of the positional displacements is within the first predefined range; and outputting, by the computer, information to modify the correction mask pattern provided in a case where the average of the positional displacements is out of the second predefined range.

2. The method according to claim 1, wherein the information is amounts of shifts of the edge as determined at the evaluation points.

3. The method according to claim 2, wherein leading out the information includes:
extracting the maximum value out of the positional displacements computed for the evaluation points; and
determining the amount of shift of the edge of the desired pattern corresponding to the maximum value.

4. The method according to claim 3, wherein the information is a quantity obtained by dividing the maximum positional displacement by a constant.

5. The method according to claim 4, wherein the constant is a mask error factor.

6. A computer-implemented method of correcting a mask pattern design, the method comprising:
preparing, by a computer, a desired pattern and a mask pattern to form a first transferred/formed pattern corresponding to the desired pattern on a substrate, the mask pattern comprising an edge;
generating, by the computer, a plurality of edges by dividing the edge of the mask pattern by a predetermined length;
defining a correction point on the plurality of edges to generate a plurality of correction points;
computing, by the computer, a correction quantity in consideration of the proximity effect for the plurality of correction points to generate a plurality of correction quantities;
forming, by the computer, a correction mask pattern by moving the plurality of edges according to the plurality of correction quantities, the correction mask pattern comprising an edge;
defining at least one evaluation point on the edge of the correction mask pattern;
defining at least one process parameter to form a second transferred/formed pattern which is either a resist pattern formed on the substrate by using the correction mask pattern or a pattern formed on the substrate by using the resist patterns as a mask;
defining a reference value and a variable range for the at least one process parameter;
generating, by the computer, a combination of parameter values by varying the at least one process parameter within the variable range;

computing, by the computer, a positional displacement for the combination of the parameter values to generate a plurality of positional displacements, wherein the positional displacement is a positional displacement between at least one first point on the second transferred/formed pattern and the at least one evaluation point, wherein the at least first point corresponds to the at least one evaluation point, and wherein the combination of the parameter values provide an asymmetric distribution of positional displacements relative to the desired pattern;

computing, by the computer, a statistic of the plurality of positional displacements;

outputting, by the computer, information to modify the mask pattern according to the statistic;

comparing the standard deviation of the positional displacements and a third predefined range;

outputting, by the computer, information to modify the desired pattern provided in a case where the standard deviation of the positional displacements is out of the third predefined range; or comparing the mode of the positional displacements and a fourth predefined range provided in a case where the standard deviation of the positional displacements is within the third predefined range; and outputting, by the computer, information to modify the correction mask pattern provided in a case where the mode of the positional displacements is greater than the fourth predefined range.

7. A system of correcting a mask pattern design, the method comprising:
a storing section configured to store a desired pattern and a mask pattern to form a first transferred/formed pattern corresponding to the desired pattern on a substrate, the mask pattern comprising an edge;
a dividing section configured to generate a plurality of edges by dividing the edge of the mask pattern by a predetermined length;
a correction point defining section configured to define a correction point on the plurality of edges to generate a plurality of correction points;
a correction quantity computing section configured to compute a correction quantity, taking the proximity effect into consideration, for the plurality of correction points to generate a plurality of correction quantities;
a forming section configured to form a correction mask pattern by deforming the mask pattern according to the plurality of correction quantities, the correction mask pattern comprising an edge;
an evaluation point defining section configured to define at least one evaluation point on the edge of the correction mask pattern;
a process parameter defining section configured to define at least one process parameter to form a second transferred/formed pattern which is either a resist pattern formed on the substrate by using the correction mask pattern or a pattern formed on the substrate by using the resist patterns as a mask;
a reference value and a variable range defining section configured to define a reference value and a variable range for the at least one process parameter;
a combination of parameter values generating section configured to generate a combination of parameter values by varying the at least one process parameter within the variable range;
a positional displacement computing section configured to compute a positional displacement for the combination of the parameter values to generate a plurality of positional displacements, wherein the positional displacement is a positional displacement between at least one first point on the second transferred/formed pattern and the at least one evaluation point, and wherein the at least first point corresponds to the at least one evaluation point;

a statistic computing section configured to compute a statistic of the plurality of positional displacements;

an outputting section configured to output information to modify the mask pattern according to the statistic;

a comparing section configured to compare the standard deviation of the positional displacements and a first predefined range;

a changing section configured to change the desired pattern provided in a case where the standard deviation of the positional displacement is out of the first predefined range;

a comparing section configured to compare the average of the positional displacements and a second predefined range provided in a case where the standard deviation of the positional displacements is within the first predefined range; and an outputting section configured to output information to modify the correction mask pattern provided in a case where the average of the positional displacements is out of the second predefined range.

* * * * *